(12) United States Patent
Wu et al.

(10) Patent No.: US 9,490,517 B2
(45) Date of Patent: Nov. 8, 2016

(54) HIGH FREQUENCY POWER COMBINER/DIVIDER

(71) Applicant: Nuvotronics, LLC, Radford, VA (US)

(72) Inventors: Donald X. Wu, Diamond Bar, CA (US); David Sherrer, Cary, NC (US); Jean-Marc Rollin, Chapel Hill, NC (US)

(73) Assignee: Nuvotronics, Inc., Radford, VA (US)

( * ) Notice: Subject to any disclaimer, the term of this patent is extended or adjusted under 35 U.S.C. 154(b) by 0 days.

(21) Appl. No.: 14/741,775

(22) Filed: Jun. 17, 2015

(65) Prior Publication Data

US 2016/0036113 A1 Feb. 4, 2016

Related U.S. Application Data

(63) Continuation of application No. 13/726,073, filed on Dec. 22, 2012, now Pat. No. 9,065,163.

(60) Provisional application No. 61/580,100, filed on Dec. 23, 2011.

(51) Int. Cl.
*H01P 5/12* (2006.01)
*H01P 3/12* (2006.01)
*H01P 11/00* (2006.01)
*H03F 3/195* (2006.01)
*H03F 3/21* (2006.01)
*H03F 3/60* (2006.01)
*H01P 5/02* (2006.01)

(52) U.S. Cl.
CPC . *H01P 3/12* (2013.01); *H01P 5/12* (2013.01); *H01P 11/002* (2013.01); *H03F 3/195* (2013.01); *H03F 3/211* (2013.01); *H03F 3/602* (2013.01); *H01P 5/024* (2013.01)

(58) Field of Classification Search
CPC ......... H01P 3/12; H01P 5/12; H01P 11/002; H01P 5/024; H03F 3/195; H03F 3/211; H03F 3/602
USPC ....................................................... 333/137
See application file for complete search history.

(56) References Cited

U.S. PATENT DOCUMENTS

| 2,502,479 | A |   | 4/1950 | Pearson |
| 3,023,382 | A | * | 2/1962 | Borghetti ............... H01P 5/103 333/252 |
| 4,590,446 | A |   | 5/1986 | Hsu |
| 4,812,782 | A |   | 3/1989 | Ajioka |
| 5,079,527 | A |   | 1/1992 | Goldfarb |

(Continued)

FOREIGN PATENT DOCUMENTS

WO   2012003506   1/2012

OTHER PUBLICATIONS

Ali Darwish et al.; Three Dimensional Transmission Lines and Power Divider Circuits; 2009 IEEE; pp. 184-190.

(Continued)

*Primary Examiner* — Robert Pascal
*Assistant Examiner* — Kimberly Glenn
(74) *Attorney, Agent, or Firm* — Niels Haun; Dann, Dorfman, Herrell and Skillman, P.C.

(57) ABSTRACT

Radio frequency (RF) power amplifiers are provided which may include high power, wideband, microwave or millimeter-wave solid state power amplifiers based on waveguide power combiner/dividers.

15 Claims, 21 Drawing Sheets

(56) References Cited

U.S. PATENT DOCUMENTS

| | | | |
|---|---|---|---|
| 5,117,377 A | 5/1992 | Finman | |
| 5,126,704 A | 6/1992 | Dittmer | |
| 5,222,246 A | 6/1993 | Wolkstein | |
| 5,287,069 A | 2/1994 | Okubo | |
| 5,736,898 A | 4/1998 | Kohl | |
| 5,872,491 A | 2/1999 | Kim | |
| 5,880,648 A | 3/1999 | Aves | |
| 5,884,143 A | 3/1999 | Wolkstein | |
| 5,953,811 A | 9/1999 | Mazzochette | |
| 6,046,609 A | 4/2000 | Toyoshima | |
| 6,046,649 A | 4/2000 | Lange | |
| 6,242,984 B1 | 6/2001 | Stones | |
| 6,411,174 B1 * | 6/2002 | Crouch | H01P 5/12 333/125 |
| 6,483,397 B2 | 11/2002 | Catoiu | |
| 6,614,325 B1 | 9/2003 | Kocin | |
| 6,753,807 B1 | 6/2004 | McLaughlin | |
| 6,799,020 B1 | 9/2004 | Heidmann | |
| 6,982,613 B2 | 1/2006 | Wu | |
| 7,012,489 B2 | 3/2006 | Sherrer | |
| 7,113,056 B2 | 9/2006 | Wu | |
| 7,148,772 B2 | 12/2006 | Sherrer | |
| 7,227,428 B2 | 6/2007 | Fukunaga | |
| 7,271,680 B2 | 9/2007 | Hall | |
| 7,312,673 B2 | 12/2007 | Wu | |
| 7,382,212 B2 | 6/2008 | Lo Hine Tong | |
| 7,385,462 B1 | 6/2008 | Epp | |
| 7,405,638 B2 | 7/2008 | Sherrer | |
| 7,463,109 B2 | 12/2008 | Ilo | |
| 7,482,894 B2 | 1/2009 | Wu | |
| 7,598,805 B2 | 10/2009 | Staudinger | |
| 7,616,058 B1 | 11/2009 | Nezakati | |
| 7,623,006 B2 | 11/2009 | Ezzeddine | |
| 7,649,432 B2 | 1/2010 | Sherrer | |
| 7,656,256 B2 | 2/2010 | Houck | |
| 7,746,175 B2 | 6/2010 | Rector | |
| 7,755,174 B2 | 7/2010 | Rollin | |
| 7,898,356 B2 | 3/2011 | Sherrer | |
| 7,932,781 B2 | 4/2011 | Lopez | |
| 7,948,335 B2 | 5/2011 | Sherrer | |
| 8,031,037 B2 | 10/2011 | Sherrer | |
| 8,698,577 B2 | 4/2014 | Sherrer | |
| 8,952,752 B1 | 2/2015 | Huettner | |
| 9,065,163 B1 | 6/2015 | Wu | |
| 9,413,052 B2 | 8/2016 | Sherrer | |
| 2003/0174018 A1 | 9/2003 | Cooper | |
| 2005/0174194 A1 | 8/2005 | Wu | |
| 2007/0001907 A1 | 1/2007 | Hall | |
| 2011/0187453 A1 | 8/2011 | Deckman | |
| 2012/0062335 A1 | 3/2012 | Sherrer | |
| 2013/0050055 A1 | 2/2013 | Paradiso | |

OTHER PUBLICATIONS

Ali Darwish et al.; Vertical Balun and Wilkinson Divider; 2002 IEEE MTT-S Digest; pp. 109-112. NPL_30.

Anthony A, Immorlica, Jr. et al.; Miniature 3D Micro-Machined Solid State Power Amplifiers; Distribution Statement 'A' (Approved for Public Release, Distribution Unlimited). Apr. 9, 2008.

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Chen, A.C., "Development of Low-Loss Broad-Band Planar Baluns Using Multilayered Organic Thin Films," IEEE Transactions on Microwave Theory and Techniques, vol. 53, No. 11, pp. 3648-3655, Nov. 2005.

Colantonio, P., et al., "High Efficiency RF and Microwave Solid State Power Amplifiers," pp. 380-395, 2009.

Comtech EF Data, PCT-4000, 1+1 Phase Combiner Installation and Operation Manual, Revision 2, Oct. 9, 2012. http://www.comtechefdata.com/files/manuals/mn-amplifiers-pdf/mn-pcb4000.pdf.

CPI, Power Amplifer Phase (Power) Combining, Jun. 8, 2005. http://www.ramayes.com/Data%20Files/Communications%20Power%20Industries/CPI%201000-Watt%20Amplifier%20System.pdf.

Dong, Y., et al., '60 GHz Low Loss, Amplitude and Phase Balanced Radial Waveguide Power Combiner', International Conference on Communications and Control, Sep. 9-11, 2011, pp. 4077-4073.

Ehsan, N., "Broadband Microwave Litographic 3D Components," Dissertation 2009.

Ehsan, N. et al., "Microcoaxial lines for active hybrid-monolithic circuits," 2009 IEEE MTT-S Int. Microwave.Symp. Boston, MA, Jun. 2009.

Filipovic, D. et al., "Monolithic rectangular coaxial lines. Components and systems for commercial and defense applications," Presented at 2008 IASTED Antennas, Radar, and Wave Propagation Conferences, Baltimore, Md, USA, Apr. 2008.

Filipovic, D.S., "Design of microfabricated rectangular coaxial lines and components for mm-wave applications," Microwave Review, vol. 12, No. 2, Nov. 2006, pp. 11-16.

Guannella, G., 'Novel Matching Systems for High Frequencies,': Brown-Boveri Review, vol. 31, Sep. 1944, pp. 327-329.

Immorlica, Jr., T. et al., "Miniature 3D micro-machined solid state power amplifiers," COMCAS 2008.

Ingram, D.L. et al., "A 427 mW 20% compact W-band InP HEMT MMIC power amplifier," IEEE RFIC Symp. Digest 1999, pp. 95-98.

Lukic, M. et al., "Surface-micromachined dual Ka-band cavity backed patch antennas," IEEE Trans. AtennasPropag., vol. 55, pp. 2107-2110, Jul. 2007.

Oliver, J.M. et al., "A 3-D micromachined W-band cavity backed patch antenna array with integrated rectacoax transition to wave guide," 2009 Proc. IEEE International Microwave Symposium, Boston, MA 2009.

Palacios, T. et al., "High-power AlGaN/GaN HEMTs for Ka-band applications," IEEE Electron Device Letters 26, No. 11 (2005): 781-783.

Q Guo et al., A Novel Broadband High-Power Combiner, 2005 IEEE Asia Pacific Microwave Conference Proceedings.

Rollin, J.M. et al., "A membrane planar diode for 200GHz mixing applications," 29th International Conference on Infrared and Millimeter Waves and Terahertz Electronics, pp. 205-206, Karlsrube, 2004.

Rollin, J.M. et al., "Integrated Schottky diode for a sub-harmonic mixer at millimetre wavelengths," 31st International Conference on Infrared and Millimeter Waves and Terahertz Electronics, Paris, 2006.

Saito, Y., Fontaine, D., Rollin, J-M., Filipovic, D., 'Micro-Coaxial Ka-Band Gysel Power Dividers,' Microwave Opt Technol Lett 52: 474-478, Feb. 2010.

Saito et al., "Analysis and design of monolithic rectangular coaxial lines for minimum coupling," IEEE Trans. Microwave Theory Tech., vol. 55, pp. 2521-2530, Dec. 2007.

Sherrer, D, Vanhille, K, Rollin, J.M., 'PolyStrata Technology: A Disruptive Approach for 3D Microwave Components and Modules,' Presentation (Apr. 23, 2010).

Vanhille, K., 'Design and Characterization of Microfabricated Three-Dimensional Millimeter-Wave Components,' Dissertation, 2007.

Vanhille, K., et al., 'A Capacitively-Loaded Quasi-Planar Ka-Band Resonator', 36th European Microwave Conference, Sep. 10-15, 2006.

Vanhille, K., et al., "Quasi-Planar High-Q Millimeter Wave Resonators", IEEE Transactions on Microwave Theory and Techniques, Jun. 2006.

Vanhille, K. et al., 'Balanced low-loss Ka-band-coaxial hybrids,' IEEE MTT-S Dig., Honolulu, Hawaii, Jun. 2007.

Vanhille, K. et al., "Ka-Band surface mount directional coupler fabricated using micro-rectangular coaxial transmission lines," 2008 Proc. IEEE International Microwave Symposium, 2008.

(56) References Cited

OTHER PUBLICATIONS

Vanhille, K.J. et al., "Ka-band miniaturized quasi-planar high-Q resonators," IEEE Trans. Microwave Theory Tech., vol. 55, No. 6, pp. 1272-1279, Jun. 2007.

Vyas R. et al., "Liquid Crystal Polymer (LCP): The ultimate solution for low-cost RF flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Tech., vol. 39, pp. 9-16, Jan. 2001.

Written Opinion of the International Searching Authority mailed Jan. 5, 2012 on PCT/US2011/042902. Jan. 5, 2012.

Written Opinion of the International Searching Authority mailed Jan. 5, 2012 on PCT/US2011/042902.

York, R.A., et al., "Some considerations for optimal efficiency and low noise is large power combiners," IEEE Transactions on Microwave Theory and Techniques, vol. 49, No. 8, Aug. 2001.

Extended EP Search Report for EP Application No. 11801527.0 dated Oct. 13, 2014.

\* cited by examiner

HIGH FREQUENCY POWER COMBINER/DIVIDER

RELATED APPLICATIONS

This application is a continuation of U.S. application Ser. No. 13/726,073 filed on Dec. 22, 2012, now U.S. Pat. No. 9,065,163, which claims the benefit of priority of U.S. Provisional Application No. 61/580,100, filed on Dec. 23, 2011, the entire contents of which applications are incorporated herein by reference.

GOVERNMENT LICENSE RIGHTS

This invention was made with government support under contract number #FA8650-11-C-1159 awarded by U.S. Air Force. The government has certain rights in the invention.

FIELD OF THE INVENTION

The present invention relates generally to radio frequency (RF) power amplifiers, and more particularly but not exclusively to high power, wideband, microwave or millimeter-wave solid state power amplifiers based on waveguide power combiner/dividers.

BACKGROUND OF THE INVENTION

Current high power microwave amplifier applications usually employ travelling wave tubes (TWT) to provide microwave power magnification. However, the drawbacks of TWT amplifiers are significant, such as considerable size and weight. Further, TWT amplifiers require a high voltage driver, such as an electronic power conditioner, that in turn necessitates additional complex accessory circuits and involves high voltage risk. To work linearly, TWT amplifiers are normally backed off from their saturated output power or additional linearization circuits are added, and linearization circuitry usually results in a dramatic increase in the system complexity and cost. In addition, vacuum tubes, including TWT's, typically require operation at a designed output power; however, atmospheric variation may require a source that can change its power level based on conditions in the transmit/receive path. This inevitable variability can often lead to running an amplifier either at too high or too low of a power level for the conditions at hand and can lead to unnecessarily high levels of power consumption. Furthermore, often power amplifiers are required to feed systems that demand continuous operation without substantial interruption, and therefore may require a back-up to be ready and waiting in the event of failure of the primary amplifier. Due to the long warm-up times of vacuum tubes, often an identical tube or power supply needs to be idling in the event of failure of the first tube, further degrading the ability to meet demands for small size, weight, and power efficiency as is often needed for communications satellites, mobile ground stations, radar systems, and other applications especially those supporting mobile, airborne, and space environments.

Alternatively, a solid state power amplifier (SSPA) module for satellite, terrestrial, aerospace, and/or unmanned aerial vehicle (UAV) applications may require compact size and light weight. Further, such applications may require an SSPA module that has more power than one monolithic microwave integrated circuit (MMIC) chip can provide. The SSPA continues to advance into the territory traditionally dominated by the vacuum tube amplifier in terms of increased frequency, power, and bandwidth as the MMIC chips to support them continue to advance, for example with advances in GaN and GaAs semiconductor technology. There are various ways to power combine MMICs into a higher power SSPA assembly. Existing SSPA designs are based on power combiners, such as radial combiners, but they sometimes tend to be bulky, heavy, and/or require complex machining. In an effort to reduce this complexity, such waveguide components are sometimes made in two parts that are assembled, often called a "split block". Even though split block waveguide structure/combiners can be used to reduce machining complexity, the SSPA may suffer from both leakage problems and joining problems. This problem of building a waveguide from separate parts that must be joined, and general insertion and return loss problems over the bandwidth required, can be compounded or increased by the tolerances and structural accuracy needed to properly guide the propagating waves in a hollow waveguide construction. For example, to minimize the insertion loss and return loss, integration of conductive signal line based waveguides, such as microstrip, CPW (Co-Planar Waveguide), or coax, with hollow waveguides is additionally complicated due to tolerances and alignment that may be required. Because a high power SSPA usually has high loop gain, the RF leakage of a multi-part or traditional combiner system could severely degrade the system performance. In addition, existing SSPA designs may be difficult to manufacture at high frequency, for example at V-band and W-band, and their size and weight may increase the cost of launching a satellite into orbit or make UAV (Unmanned Aerospace Vehicle) applications impossible.

One difficulty faced by previous SSPA designs is that they do not work well at high frequencies. Commonly used components, such as stripline, microstrip line, coax, splitter and combiner structures, all include parasitic effects and may suffer material/substrate loss. Higher frequency signals may be significantly attenuated when passing through these structures. Parasitic effects of interconnections, splitters, combiner structures, and/or the materials used to propagate the signal may contribute to the frequency limitations inherent with the SSPA designs in the art. As frequency increases, the tolerances and accuracy between the electromagnetically critical elements within the passive combining and feed structures become increasingly sensitive to error and so methods of construction that work well at several or several 10's of GHz are unsuitable for obtaining high performance at 40, 60, 90, 180, or 240 GHz.

SSPA designs may include a large number of components that must be manually assembled and tuned after assembly. Many individual pieces of existing SSPA designs require complex machining, such as, for example, extremely high precision milling, wire Electric Discharge Machining (EDM) and/or laser processes which lead to relatively high manufacturing costs and challenges in the part integration and bonding to produce a device with sufficiently good electromagnetic properties, for example, in terms of accumulative insertion and/or return loss. Additionally, in some circumstances, required machining tolerances at high frequencies make mass production difficult because every SSPA may have to be manually assembled and tuned to compensate for the manufacturing tolerances. Accordingly, there may be a need for a solid state high power amplifier module which has more desirable cost, size, precision forming, precision assembly, and/or reliability attributes and that readily lends itself to scalable, and cost-effective, manufacturing methods.

SUMMARY OF THE INVENTION

In one of its aspects the present invention may relate to a microwave or millimeter-wave solid state high power amplifier such as those that are used in radar and satellite communication systems. An exemplary waveguide device configuration may contain at least one port to accept a transmission line mode of at least one signal line and to convert it to at least one hollow core waveguide mode within at least one hollow core waveguide combiner. The hollow core waveguide combiner may include one or more branching sections that divide or combine electromagnetic signals, which sections may meet to divide or combine energy and power from two hollow core waveguide branches. Exemplary devices may include precision electrical and/or mechanical features for the conversion between a transmission line mode and hollow waveguide radiation mode(s).

For example, in an exemplary configuration a waveguide power combiner/divider of the present invention may include a plurality of hollow waveguides having a hollow core configured to support at least one radiation mode therein. The waveguides may include first and second ends with the second ends in communication with one another to permit communication of radiation modes therebetween. The second ends may be joined in way to allow or form a common output port for the 2 or more waveguide first ends. A plurality of transmission line waveguides having a center conductor transmission line disposed therein may also be provided. Each of the transmission line waveguides, for example coaxial transmission line waveguides, may include an electromagnetic end launcher operably connected to respective first ends of the hollow waveguides. Each electromagnetic end launcher may include an elongated center conductor end portion that extends into the hollow core of the hollow waveguide. In addition, a plurality of ground posts may also be provided, each of which may be disposed at a respective end launcher in electrical communication with the center conductor and a wall of the hollow waveguide to ground the end launcher to the hollow waveguide wall.

The electrical and/or mechanical features, particularly those that require precision spatial alignment and/or 3D spatial relationships to each other, may be formed in a build sequence monolithically or directly, for example using an additive microfabrication process, such as the PolyStrata® process by Nuvotronics, LLC. As taught in this invention disclosure, by using such methods, the later alignment and assembly for transition between a plurality of signal line or transmission line based waveguides, said electromagnetic end launchers, and hollow core waveguides is not required. In such a case these relationships are determined imagewise, for example by application of successive planar photopatterns or precision machine defined patterns. In this regard, in a further of its aspects the present invention may provide a novel power combining structure based on a microfabrication process which permits the precision manufacturing of small parts, typically on a wafer, substrate, grid-level, or batch level. Other precision forming techniques such as, for example, precision milling, stereolithography, solid printing, or injection molding, may be used to create either all, or a part of, the novel power combining structures disclosed herein.

In exemplary configurations, power combining structures of the present invention may include an air-coax input power divider; pre-driver, driver, sub-amplifier modules (which may themselves include an air-coax divider and combiner, phase shifters, filters and/or linearizers), a microfabricated output waveguide combiner; and/or, an air-coax or waveguide output. The power amplifier may be made in a modular format allowing building blocks that can be independently tested and which aid in scalable products that reuse similar or identical components in their architecture. In exemplary configurations, the relationships for the mechanical elements which govern the electromagnetic properties may be addressed during the forming process. Likewise, precision integration of these components may allow them to be assembled with the necessary tolerances and precision for an intended application.

In exemplary configurations, the waveguide combiner portion of the SSPA may be fed by a number of amplifier modules (or "sub-modules") feeding each input port and the respective input port end launcher of said hollow core waveguide power combiner. Each of these amplifier modules may have multiple MMIC chips (e.g., such as 2 chips, 4 chips or 8 chips using a 2-way or 4-way or 8-way Wilkinson or Gysel sub-combiner). Such combiners as the Wilkinson or Gysel can provide higher isolation than a hollow waveguide combiner alone, for example, and can provide isolation among MMIC chips. This can help provide graceful degradation in the event of any partial or individual chip failures of the overall combining performance. For example, with an 8-way radial hollow waveguide power combiner, 32 or 64 MMIC chips may be combined together when fed by eight 4-way or 8-way micro-coaxial power combining sub-modules. In other configurations, 4-way, 8-way, 10-way, or N-way radial combiners can be used, and additional or fewer MMIC chips may be combined together. Thus the overall SSPA may be improved by combining the port protection and isolation of 2 or more chips combined using a 2 or n-way Wilkinson or Gysel, each of which modules feed an input port of the hollow core waveguide combiner. Thereby the SSPA is benefited by the low loss of hollow core waveguide combining and the port to port isolation of a transmission line combiner.

In another of its aspects, the present invention may enable precision formation of waveguide devices. For example, the structures of the present invention, such as the combining waveguide structure, may be built using a microfabrication process or another precision manufacturing technique, such as, for example, precision milling, stereolithography, electrochemical forming, chemical or photochemical etching, EDM machining, solid printing, deep RIE, stamping, LIGA, laser solidification or powders or liquids, laser machining, casting, PolyStrata® processing, transfer molding, or injection molding. Depending on the frequency of operation the waveguide combiner can be fabricated as a reduced height waveguide or as a full height waveguide at higher frequency (e.g., about 1 mm at V-band). In FIGS. 1A-15B, the combining waveguide structure may have such a reduced height depending on the frequency. Because of the ability to reduce the waveguide height, the size and weight of the combiner may be significantly minimized at lower frequency where large waveguide are needed. Since power combining may be within either air-coax and/or a waveguide combiner/divider, the SSPA or system overall loss may be lower than other designs. Furthermore, as the manufacturing tolerances may be in the micron range, the phase error may be further reduced so that the efficiency of the SSPA may be significantly improved. Several parameters in the combiner such as the end launcher 100 are very sensitive to fabrication tolerances particularly at extremely high frequency, mm wave and sub-mm wave. Fabrication precision and accuracy in this novel approach can as well keep the low loss combining performance up to such high frequencies (e.g., from 30 GHz to 300 GHz and can be applied up to 1 THz).

In a further aspect, the present invention may include a electromagnetic end launcher to provide conversion of an RF transmission line mode, such as coax, to/from a hollow waveguide radiation mode, which may have relatively low loss and increased ease of fabrication. Such an electromagnetic end launcher may be integrated directly into the waveguide manufacturing process to prevent alignment and bonding errors, whereas prior designs may have used independently fabricated, aligned, and tuned and bonded E-probes for coax to waveguide transition. (In such E-probe designs, the non-air-coax structure may cause higher loss at high frequencies, such as at the Ka-, V- and W-bands.) Additionally, a coax or air-coax to waveguide end launchers may be microfabricated monolithically with the microfabricated waveguide combiner to provide enhanced manufacturing control and/or enhanced performance. Moreover, alignment features and/or precision mechanical interlocks that enable precision registration and/or connection of such launchers, and/or MMICs, and/or connectors and/or E-probes may be incorporated into the formation process to enable precision integration and assembly of such parts with precision in the tolerances and the electrical, mechanical, thermal, and/or electromagnetic connections between them.

An added benefit of the electromagnetic end launcher designs that are grounded is the mechanical stability of such structures to vibration and thermal and mechanical shock. Having an end of the electromagnetic end launcher, or a region near an end of the electromagnetic end launcher formed, fused, adhered, or mechanically attached to a hollow waveguide wall region can suppress or prevent vibrations, oscillations, and provides stability for the geometric relations in a highly fixed manner. Eliminating such vibrations of the launcher while it is exposed to vibration or shock can prevent phase noise and other degradation of the amplified signal quality when said SSPA is exposed to such environments which are often encountered in aerospace and mobile terrestrial applications. This is particularly important when the environment for mounting or housing the SSPA is subject to severe vibrations and accelerations as may be found in a moving vehicle such as helicopter, jet, car, tank, or rocket. When formed through a multi-layer microfabrication build process such as PolyStrata®, such metal structures may be formed layer by layer. However, it should be clear as described in the PolyStrata® processes that metal could also be affixed or adhered to a defined region of dielectric such as a dielectric pedestal. The shapes and materials can be optimized using design and optimization software such as HFSS™ produced by Ansoft.

Exemplary configurations of the present invention may include one or multiple sub-modules each of which typically includes multiple MMIC chips. The sub-module may be tested separately before final assembly and/or may be replaced or repaired. All of the MMIC chips in a sub-module may be placed on a common heat sink for improved heat dissipation. Also such sub-module amplifiers may be similarly bonded to regions in or on a common planar thermal heat sink or ground plane. FIG. 15A shows an example of this architecture where modules 1514 or 1614, the waveguide power combiner 800, the input divider 1516 could all be placed onto on a common heatsink. The SSPA 1500 shows an example of such architecture, where the thermal management will be greatly enhance, improving weight, power consumption and longer term reliability to name a few. Removing the heat primarily down and out from one primary plane simplifies the housing and mounting requirements of the SSPA system and allows the areas above and around the plane to be used for interconnects and other components. Such an approach may produce a substantially more compact amplifier design than, for example, a more traditional radial waveguide approach, and may also simplify the supporting structures, such as the thermal management support. Such planar launchers and combiners may help reduce the number of layers and/or height and/or thickness required to produce the assembly.

BRIEF DESCRIPTION OF THE DRAWINGS

The foregoing summary and the following detailed description of exemplary embodiments of the present invention may be further understood when read in conjunction with the appended drawings, in which.

DETAILED DESCRIPTION OF THE INVENTION

In view of the aforementioned needs in the art, in one of its aspects the present invention provides waveguide power combiner/dividers which are designed with the recognition that RF power can be more efficiently combined/divided when the power is contained in radiation modes of hollow waveguides rather than in RF signals in transmission lines. (As used throughout this disclosure, the term "combiner/divider" is used to refer to a device having a structure which can either combine or divide RF power, depending on how the device is incorporated in an overall system architecture. For example, if a combiner/divider includes N ports at a first end and a single port at a second end, the combiner/divider may function as a divider if an input signal is provided to the single port and divided output signals delivered to the N ports; conversely, the combiner/divider may function as a combiner if input signals are provided to the N ports and a combined signal is output from the single port.)

Figure 1A:
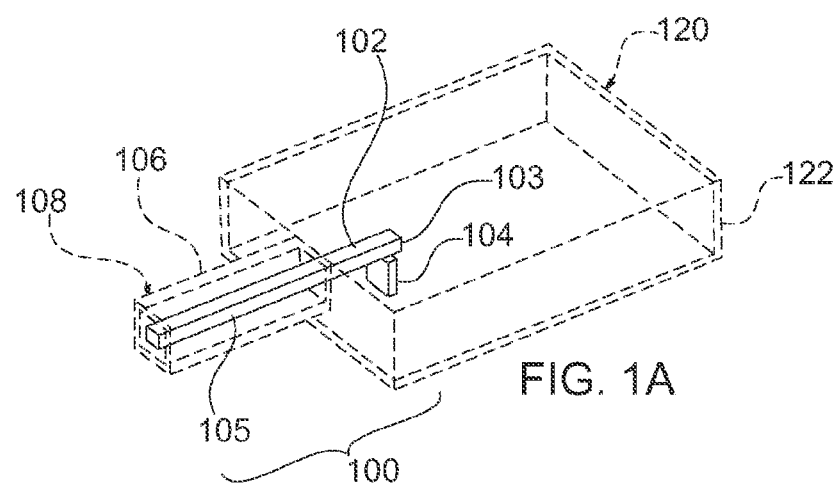
FIGS. 1A-1C schematically illustrate perspective and side elevation views, respectively, of an exemplary electromagnetic end launcher in accordance with the present invention for transitioning between a transmission line mode and hollow waveguide radiation mode, with the hollow waveguide shown in phantom.
Figure 5A:
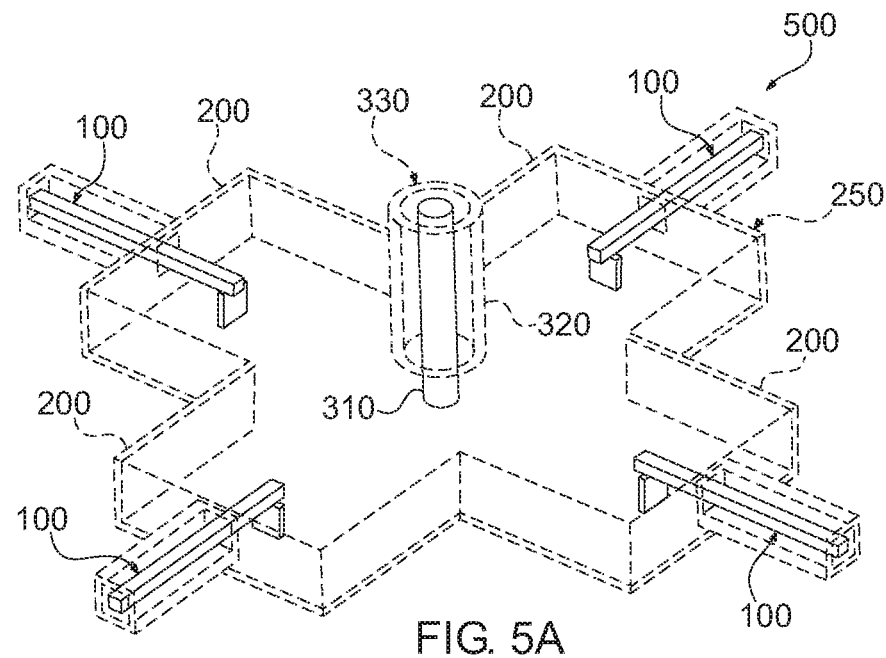
FIGS. 5A-5B schematically illustrate perspective views of exemplary 4-way waveguide power combiner/dividers in accordance with the present invention which incorporate the electromagnetic end launcher of FIGS. 1A-1C, with the hollow waveguide combiners shown in phantom.
Figure 5B:
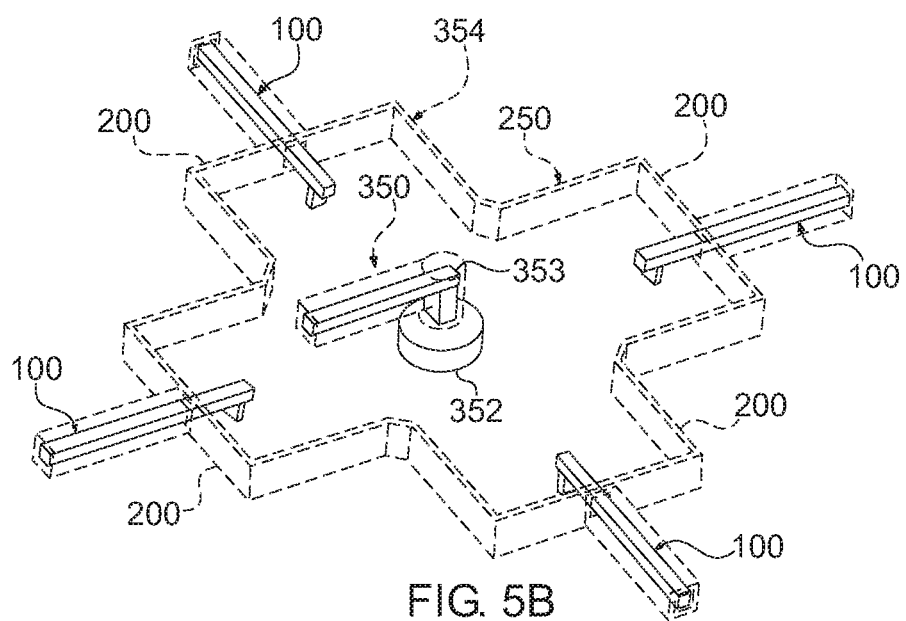
Figure 6A:
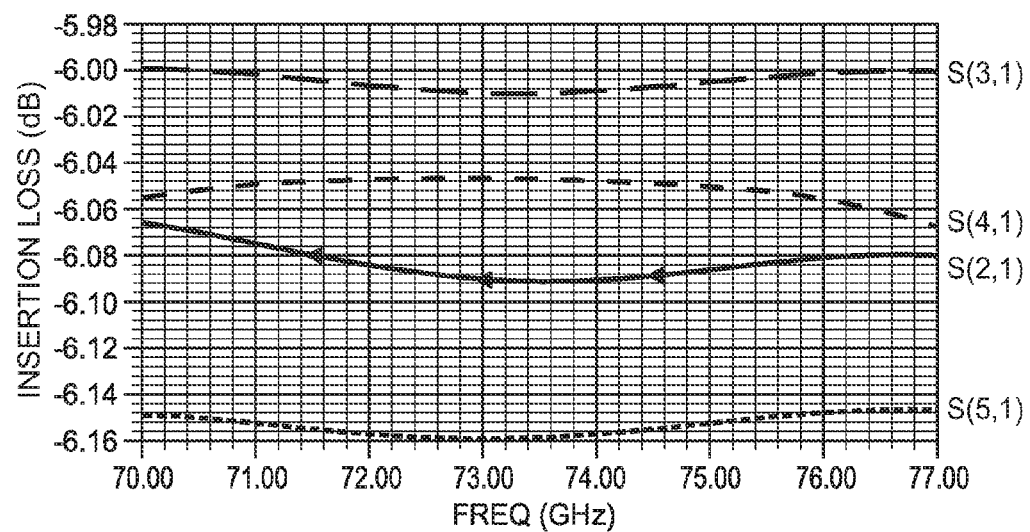
FIGS. 6A-6F illustrate the simulated performance for the power combiner/divider of FIG. 5B in terms of S-parameters over a range of frequencies when optimized for two different center frequencies (60 and 73 GHz respectively)
Figure 6B:
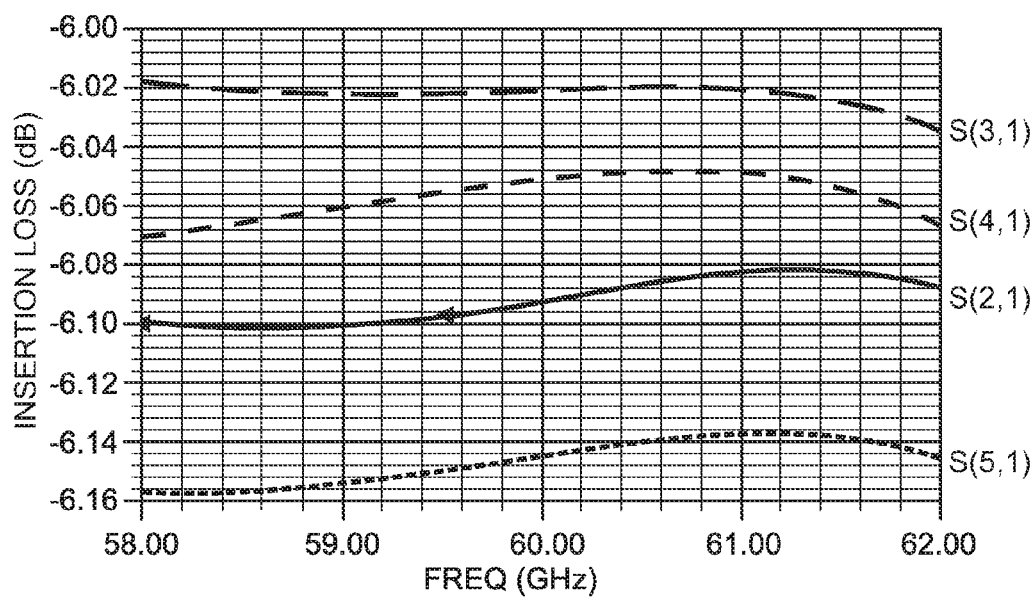
Figure 6C:
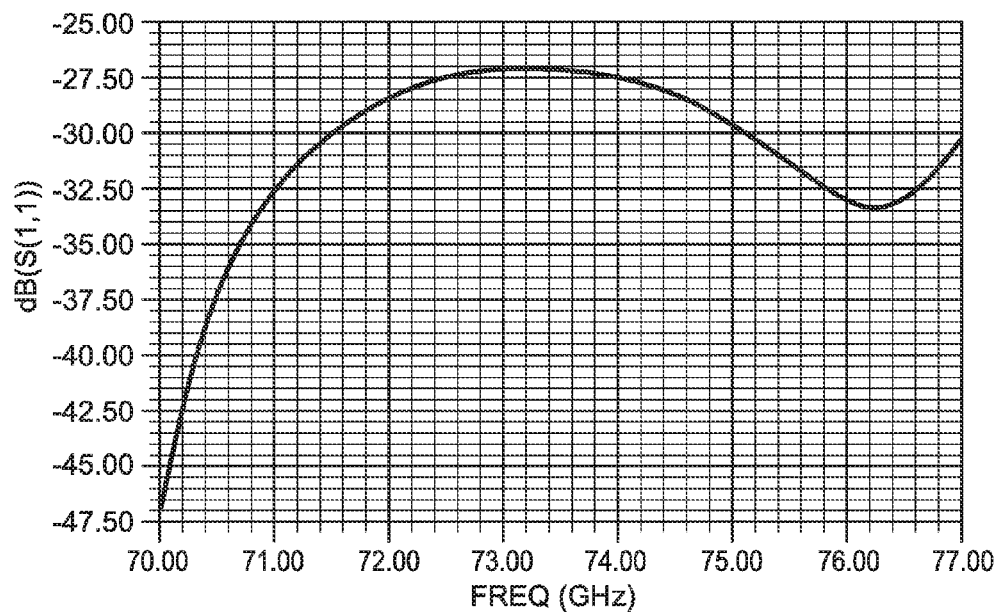
Figure 6D:
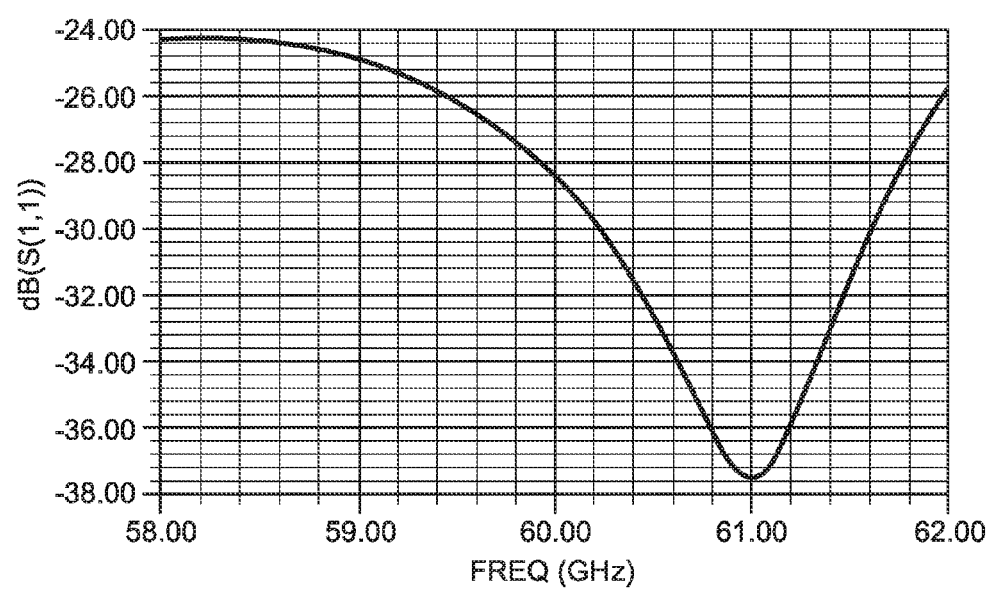
Figure 6E:
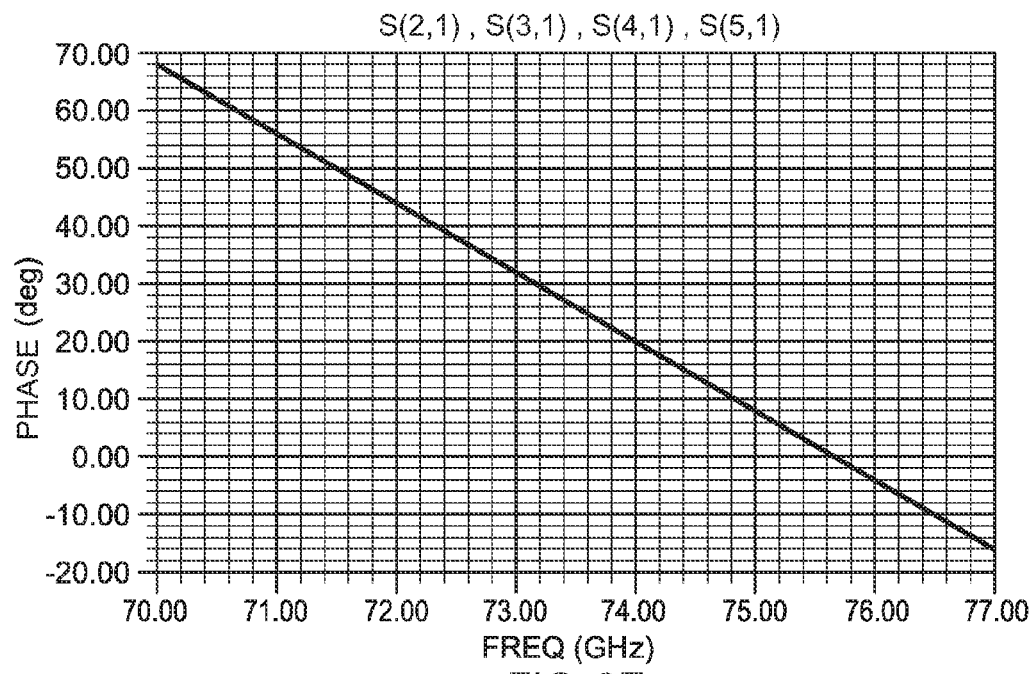
Figure 6F:
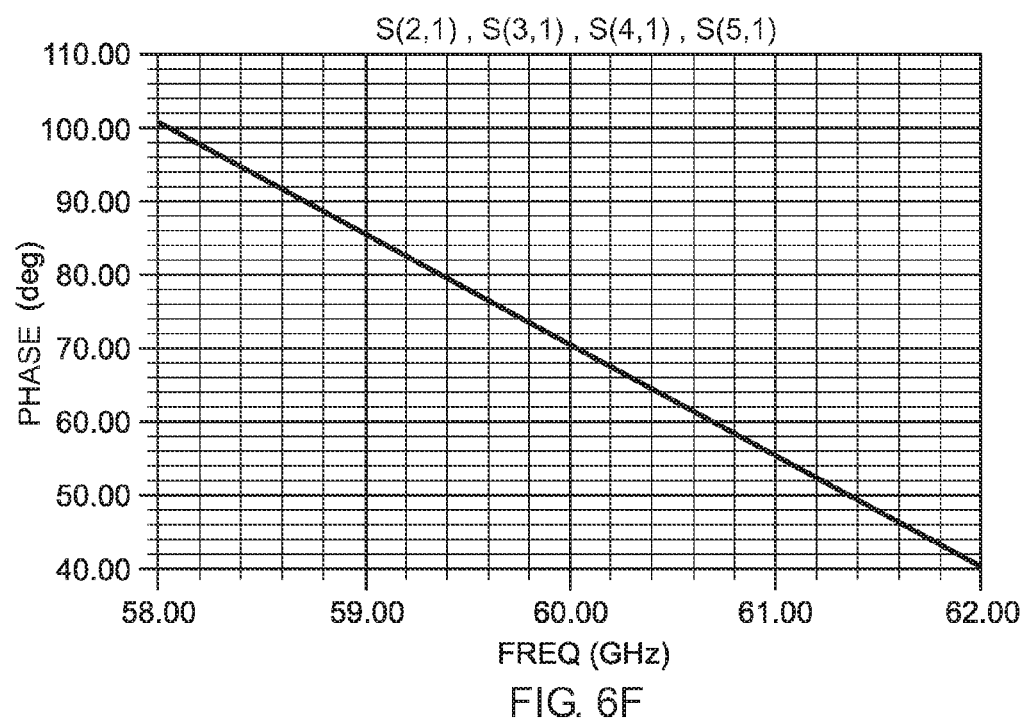

To enable practical use of power combination/division in hollow waveguide radiation modes within the context of an overall system architecture that typically transmits power in RF transmission lines (i.e., conductors), the present invention provides, in one of its aspects, an electromagnetic end launcher 100 for converting RF power to/from RF signals in a transmission line 105 from/to radiation modes of a hollow waveguide 120, FIG. 1A. Exemplary waveguide power combiner/dividers 500 in accordance with the present invention may in turn incorporate the electromagnetic end launchers 100 at one or more input/output ports of the waveguide power combiner/divider 500, FIG. 5A. Used as a combiner, for example, the waveguide power combiner/divider 500 may receive four RF transmission line signals, each input at a respective one of the electromagnetic end launchers 100, which are launched into radiation modes in respective hollow waveguide portions 200. The launched radiation modes may then combine within the waveguide 250, and the combined radiation modes may then be converted back into a transmission line mode at a transmission line output port 330, which may be provided in the form of an air-coax waveguide having a center conductor transmission line 310 and waveguide wall 320.

Figure 1B:
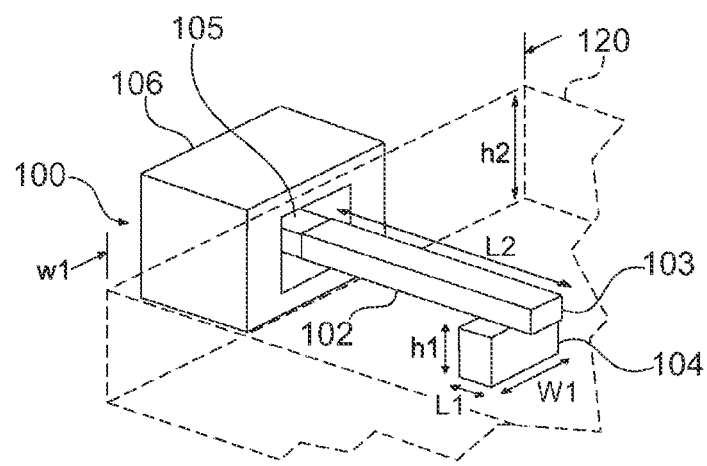
Figure 1C:
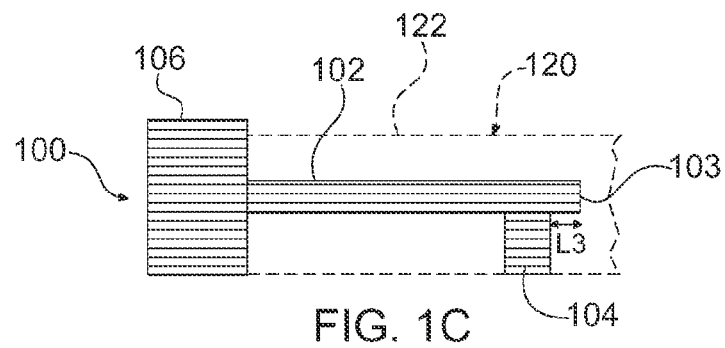
Figure 4A:
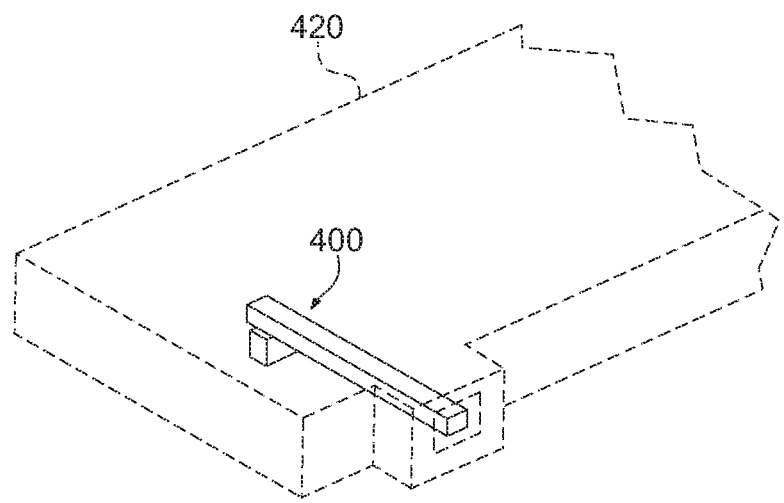
FIGS. 4A-4B schematically illustrate perspective views of two additional exemplary electromagnetic end launchers in accordance with the present invention for transitioning between a transmission line mode and hollow waveguide radiation mode, with the hollow waveguide shown in phantom.
Figure 4B:
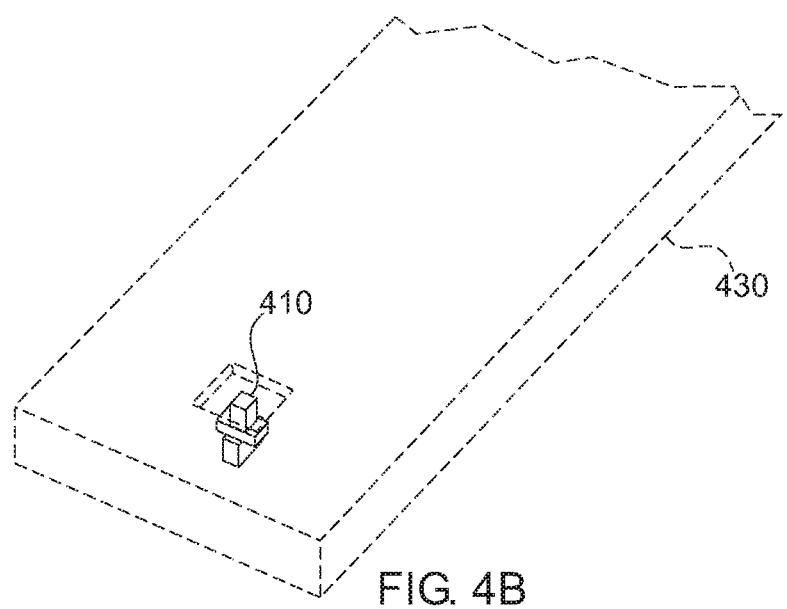

Turning to the electromagnetic end launcher 100 more specifically, and referring to the figures wherein like elements are numbered alike throughout, the exemplary electromagnetic end launcher 100 of the present invention may include a center conductor transmission line 105 which may be provided in the form of a transmission line waveguide 108, such as an air-coax waveguide having an outer coaxial waveguide wall 106 with an air dielectric therebetween, for example, FIGS. 1A-1C. The electromagnetic end launcher 100 may include a launch end 102 in the form of a longitudinally extended portion of the center conductor transmission line 105 which projects into the hollow cavity of a hollow waveguide 120 to provide an end launcher 100 in which the transmission line 105 enters the hollow waveguide 120 parallel to the plane of the hollow waveguide 120 through a waveguide sidewall. Alternative configurations are also possible in which an electromagnetic end launcher 400, 410 enters a hollow waveguide 420, 430 perpendicular to the longitudinal axis of the hollow waveguide 420, 430 either through a side surface or an upper surface of the hollow waveguide 420, 430, respectively, FIGS. 4A, 4B. In FIG. 4B the outer conductor of the coaxial transmission line is not shown protruding above the surface, however it should be clear it would typically follow a similar symmetry as illustrated in FIG. 4A.

Typically, the launch end 102 may be supported within the hollow waveguide 120 by a ground post 104 in electrical communication with the center conductor transmission line 105 and a conductive outer wall 122 of the hollow waveguide 120. The ground post 104 may have a rectangular or other suitable shape. In exemplary configurations, it may be particularly desirable that the ground post 104 be located longitudinally inward from the distal end 103 of the launch end 102 at a location such that the distal end 103 is suspended to overhang the ground post 104, i.e., L3>0, FIG. 1C. While not intending to be bound by any particular theory, it is believed that such an arrangement with L3>0 enables broader frequency of operation as well as finer tuning for lower loss operation, especially as frequency increases from a few 10's of GHz to 100's of GHz. In turn, high performance may be maintained by improving the return loss and reducing the loss from end launcher to waveguide transition. In addition, parameters believed significant to device tuning include h1, h2, L1, L2, w1, and W1, FIG. 1B. For example, the length L2 can be optimized to tune the frequency of operation relative to the height of the ground post 104 (h1) such that the total length (L2+h1) is optimized to be close to a ¼ of the design wavelength of the RF signals to be combined/divided. For instance, if the electromagnetic end launcher 100 is optimized to operate at 60 GHz, the dimensions of L2 and h1 may be 1.0 mm and 0.52 mm, respectively. Similarly, the waveguide width (w1) may be 3.76 mm for a design at V-band and 3 mm for a design at E-band.

Figure 2A:
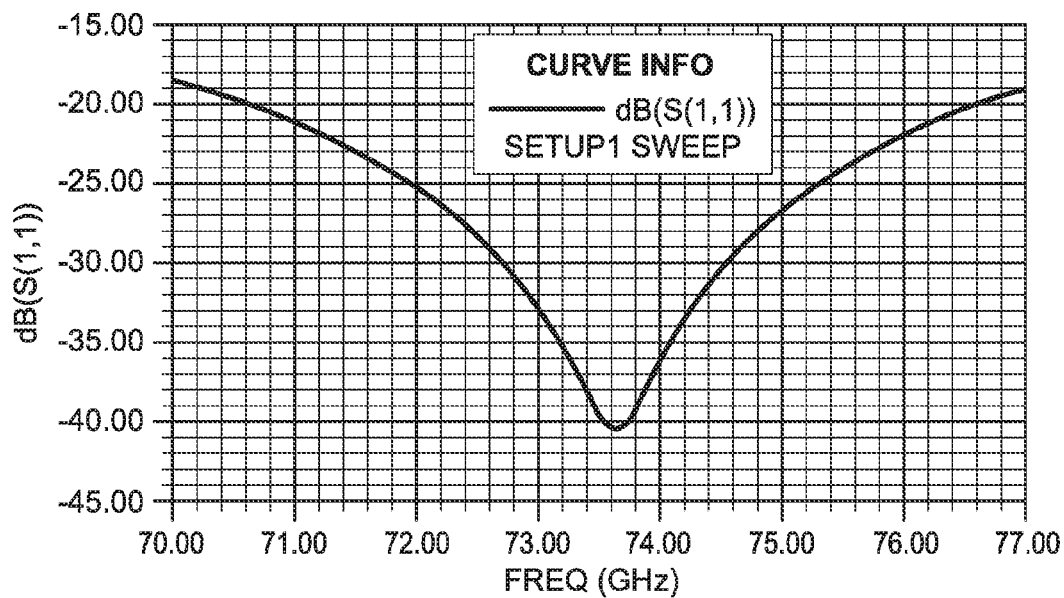
FIGS. 2A-2B illustrate the simulated performance for the electromagnetic end launcher of FIGS. 1A-1C for the reflection coefficient S(1,1) and insertion loss S(2,1), respectively.
Figure 2B:
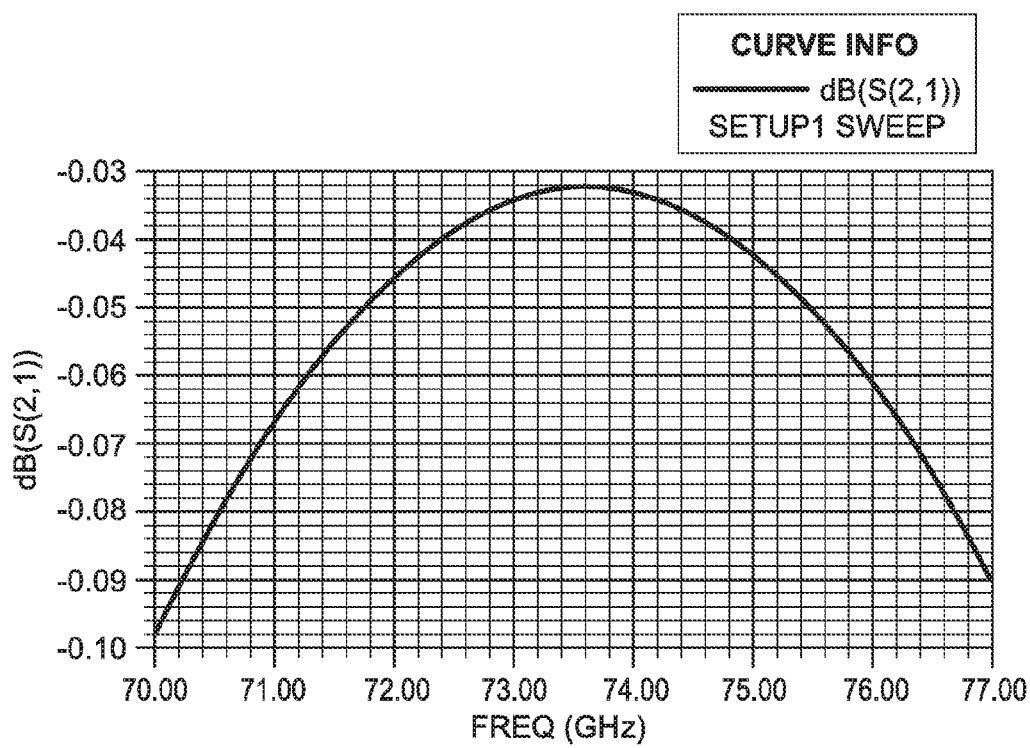

The ability to accurately control W1 and L1 is also believed to enable structures with a larger bandwidth of operation. For instance values of W1=0.7 mm and L1=0.13 mm are appropriate for use with the aforementioned values of L2 and h1. The height of the waveguide cavity h2, e.g., 1 mm, can also be optimized to further improve the insertion loss of the electromagnetic end launcher 100. For these exemplary values, simulated performance of reflection coefficient S(1,1) and insertion loss S(2,1) shows acceptable performance of the electromagnetic end launcher 100 at V and E-band, where the transmission line waveguide 108 is numbered as port 1 and the hollow waveguide 120 is numbered has port 2, FIGS. 2A, 2B. From the figures it is seen that reflection at the transmission line waveguide 108 is less than 18 dB from 70 GHz to 77 GHz, and the insertion loss from the transmission line waveguide 108 to the hollow waveguide 120 is less than 0.1 dB from 70 GHz to 77 GHz.

Figure 3A:
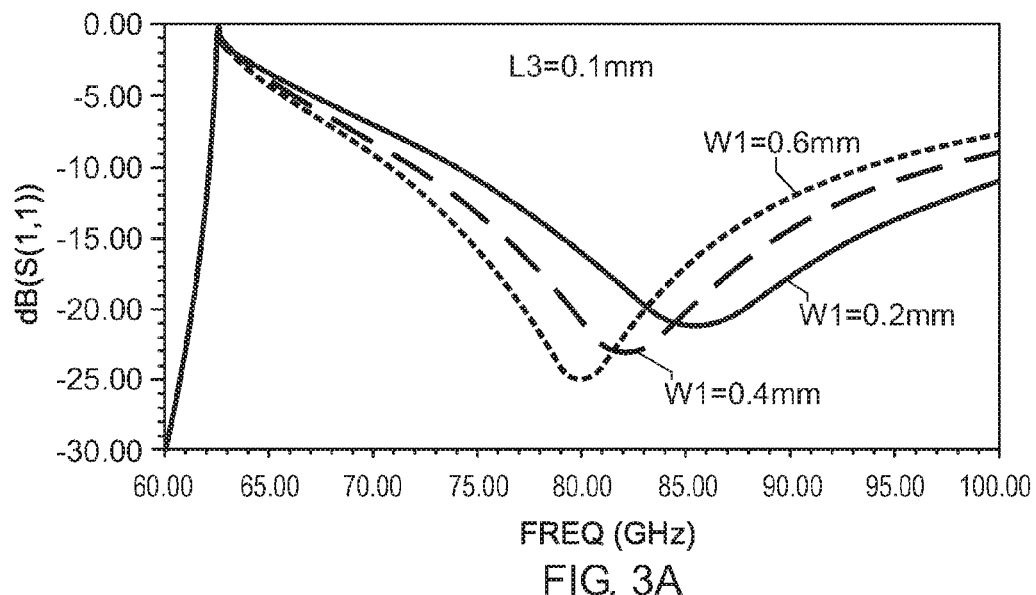
FIGS. 3A-3B illustrate the simulated performance for the hollow waveguide and electromagnetic end launcher of FIGS. 1A-1C for the reflection coefficient S(1,1) as a function of ground post width W1 and length L3.
Figure 3B:
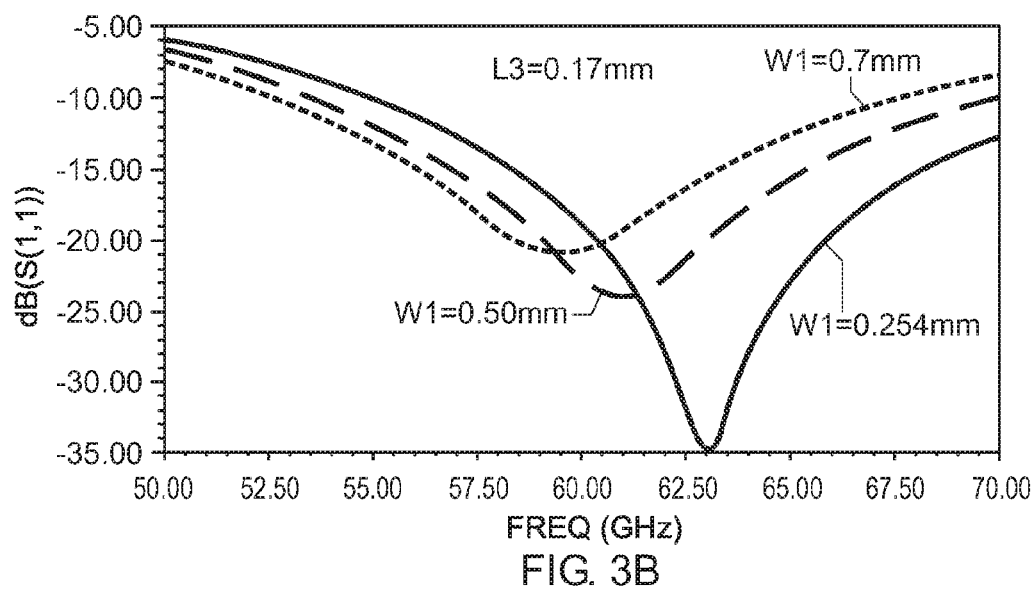
Figure 3C:
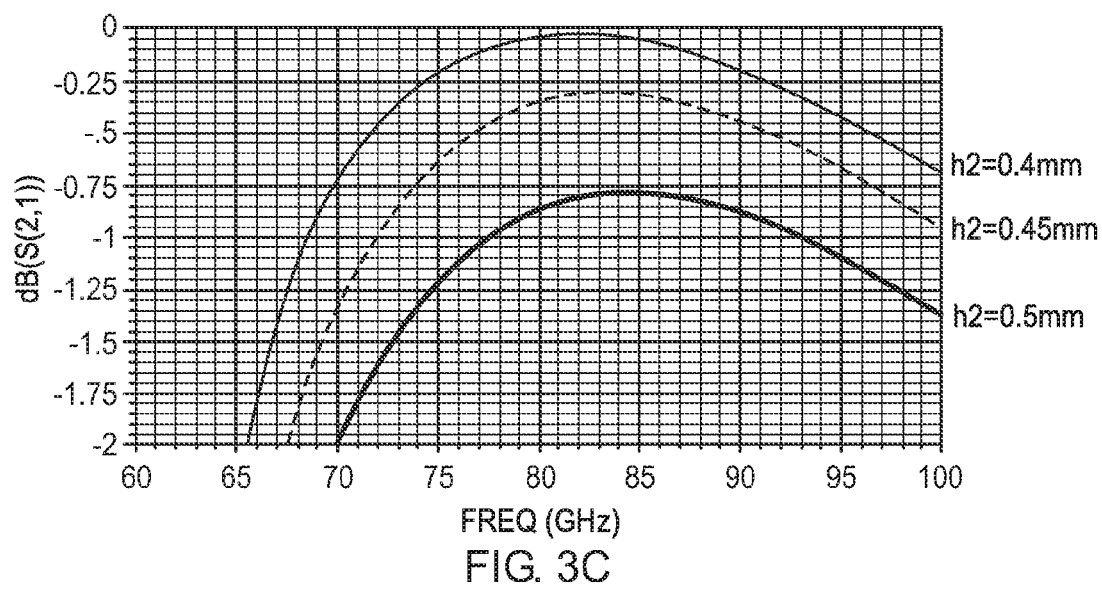
FIG. 3C illustrates the simulated performance for the hollow waveguide and electromagnetic end launcher of FIGS. 1A-1C for the insertion loss S(2,1) as a function of hollow waveguide height.
Figure 7A:
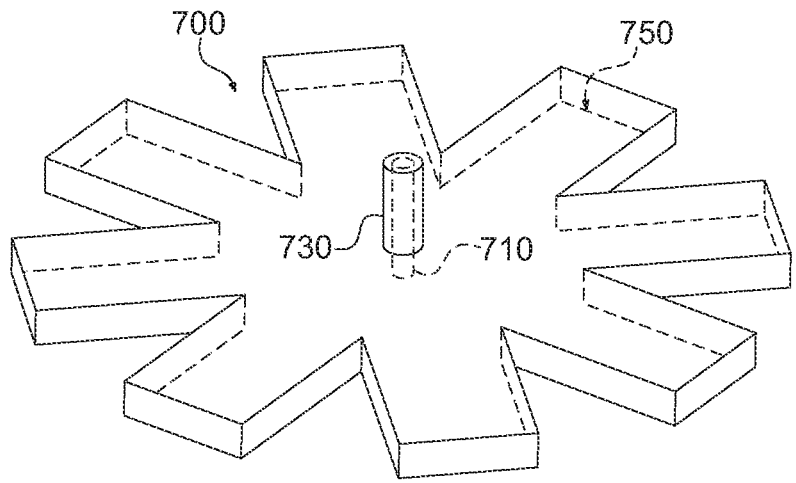
FIG. 7A schematically illustrates a perspective view of an exemplary 8-way waveguide portion of a waveguide power combiner/divider in accordance with the present invention.

As further evidence of the tuning of the electromagnetic end launcher 100 afforded by the dimensional parameters noted above, FIGS. 3A, 3B simulate the effect on impedance match as a function of variation in the width of the ground post 104. Specifically, for an overhang length L3=0.1 mm, a ground post width W1=0.6 mm is seen optimal from 50 GHz to 70 GHz, FIG. 3A, and for an overhang length L3=0.17 mm, the ground post width W1=0.254 mm is optimal from 60 GHz to 100 GHz. The remaining values used in the simulations of FIGS. 3A, 3B were L1=0.127 mm, L2=1.306 mm, h1=0.533 mm, h2=1.016 mm. Additionally, FIG. 3C simulates the effect of waveguide height h2 on insertion loss S(2,1). (The effect of overhang length L3 is best illustrated in terms of a complete power combiner/divider structure e.g., combiner/divider 700, FIG. 7A, and is thus addressed later.) The simulations also demonstrate the need for very good dimensional control and the advantages of a monolithic or nearly monolithic fabrication. The structures disclosed herein, such as electromagnetic end launcher 100, waveguide power combiner/divider 800, amplifier modules 1614, or input power divider network 1670 described below, are examples of structures leveraging these advantages. While not all of these elements require monolithic fabrication between each of them, there are geometric and mechanical tolerances within each of them that cannot typically be achieved in common high precision subtractive machining operations like precision milling. For example in FIG. 8 the perspective see-through and cross-sectional view in FIGS. 8B, 8C show the connections between the end-launcher, its electromagnetically shielded feed structure (recta-coaxial in this case), the end launcher 100 itself (a grounded probe structure) at a terminal end, and the waveguide combining structure 750 with waveguides and common combining area. There are tolerances and mechanical relationships between these elements and their dimensions that preferably range from several microns to 10 microns in the EHF range of frequencies. It can be see that there are both protruding and recessed areas in the conductive interior surface that are shown. Building such an assembly using a largely monolithic process such as a layer by layer sequential microfabrication process such as PolyStrata and/or combining the lower half (the feed structures and end-launchers in such a process and then combining the upper waveguide combiner using a "sandwich" or clam-shell configuration can enable such tolerances to be achieved. Preferably, any assembly that may be required is done in as few steps as possible so that the required tolerances are met to achieve the desired performance.

Returning to FIG. 5A, just as the electromagnetic end launchers 100 may assume various exemplary configurations, variation in the configuration of the transmission line output port 330 may also be made. For instance, the transmission line output port 330 may be provided in the form of an air coax waveguide having a center conductor 310 which may be suspended out of contact with the conductive base wall of the waveguide 250. However, such a configuration may have undesirable mechanical stability due to the suspended nature of the center conductor 310. As an alternative, a transmission line output port 350 may be provided having a center conductor 353 which is supported by a cylindrical conductive base 352 which is in turn disposed on, and supported by, a base wall of the hollow waveguide 354. For a waveguide height h2=1 mm, the conductive base may have a thickness of 0.15 mm and diameter of 0.5 mm. The performance of such structures in terms of S-parameters is simulated in FIGS. 6A-6F.

Figure 7B:
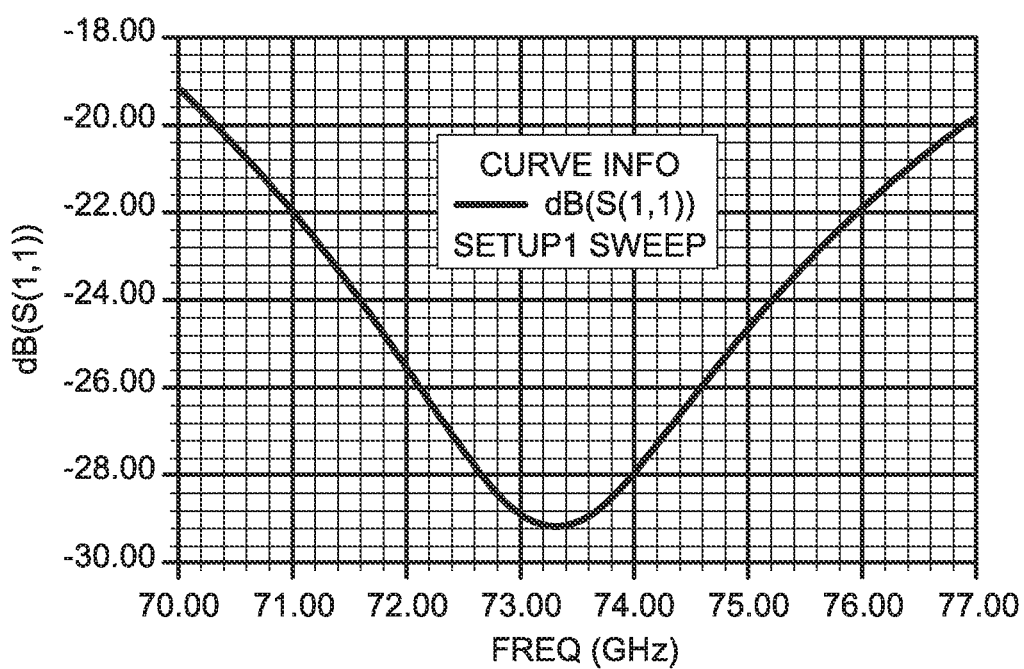
FIGS. 7B-7D illustrate the simulated performance at E band for the waveguide power combiner/divider of FIG. 7A in terms of S-parameters, where the eight ports associated with the electromagnetic end launchers are numbered as ports 2-9 and the center coax port is numbered as port 1.
Figure 7C:
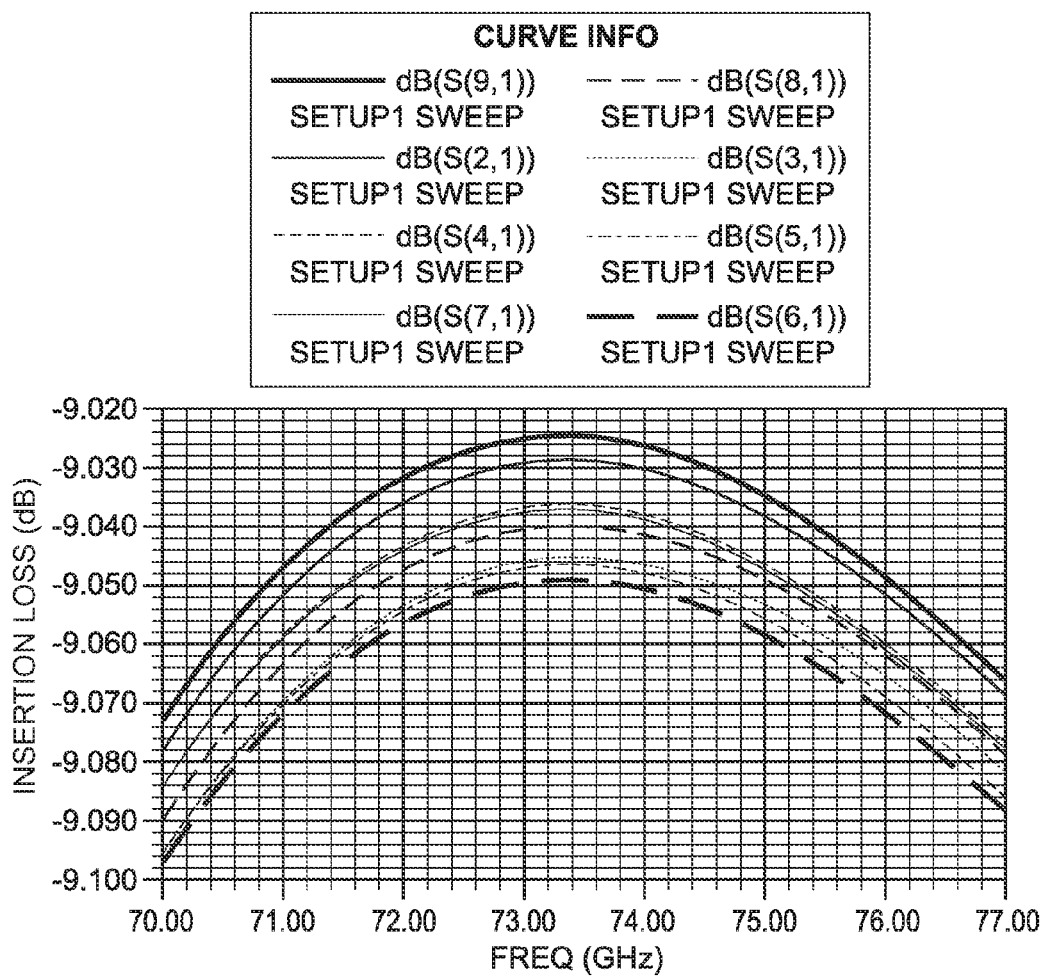
Figure 7D:
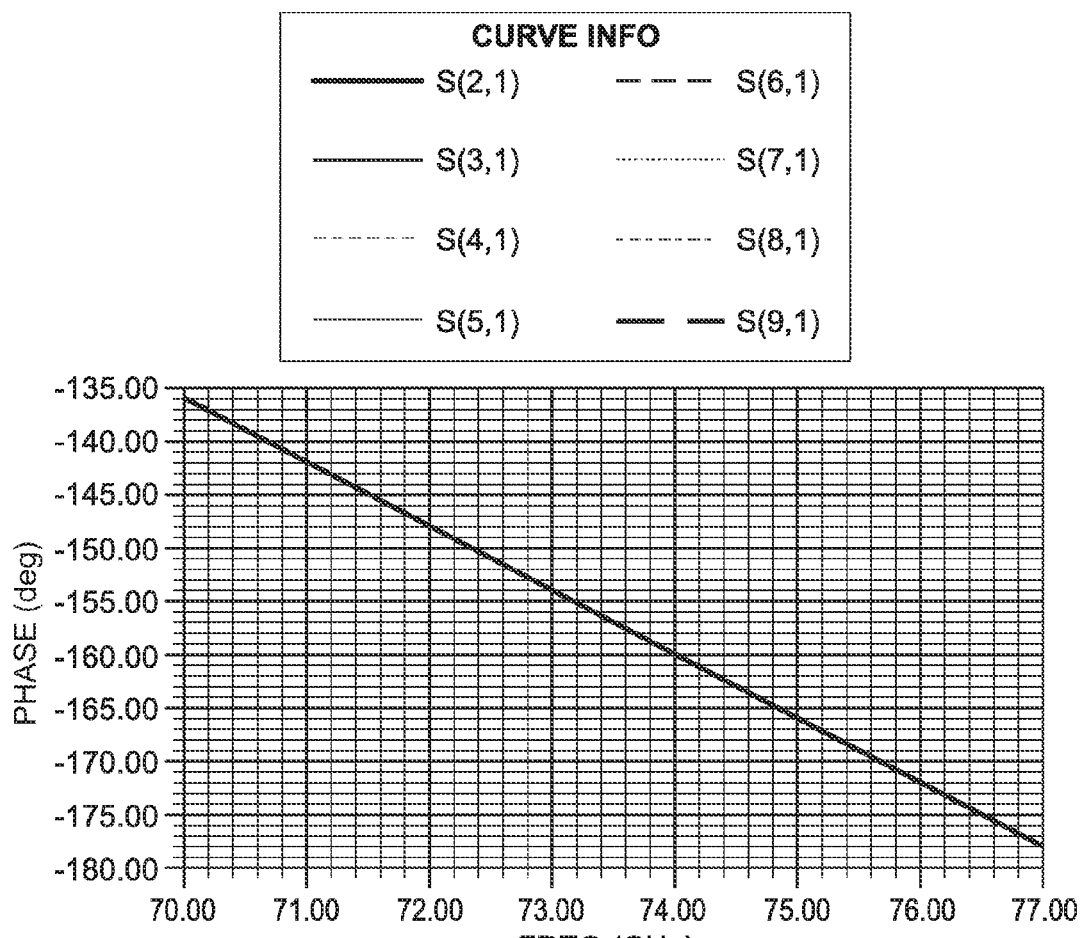

In addition to 4-way waveguide power combiners/dividers 500, a greater or fewer number of waveguide portions 200 with electromagnetic end launchers 100 may be provided in waveguide power combiner/dividers of the present invention. FIG. 7A, for example, illustrates an 8-way waveguide combiner 700 prior to fitting with electromagnetic end launchers, but including a transmission line output port 730 with center conductor 710. The width of each waveguide portion 750 may be about 3 mm, and the height of the waveguide portion 750 may be about 1 mm at V-band or 3.8 mm at E band. Simulated performance of the 8-way waveguide combiner 700 is illustrated in FIGS. 7B-7D, where the transmission line output port 730 is numbered as port 1 and the eight waveguide portions 750 are numbered as ports 2-9 for purposes of defining the S-parameters. Specifically, FIG. 7B illustrates that the reflection loss at the transmission line output port 730 is less than 19 dB from 70 GHz to 77 GHz; FIG. 7C illustrates that the insertion loss from the transmission line output port 730 to the waveguide portions 750 is less than 0.1 dB from 70 GHz to 77 GHz; and, FIG. 7D illustrates that the phase from the transmission line output port 732 to the waveguide portions 750 is identical from 70 GHz to 77 GHz.

Figure 8A:
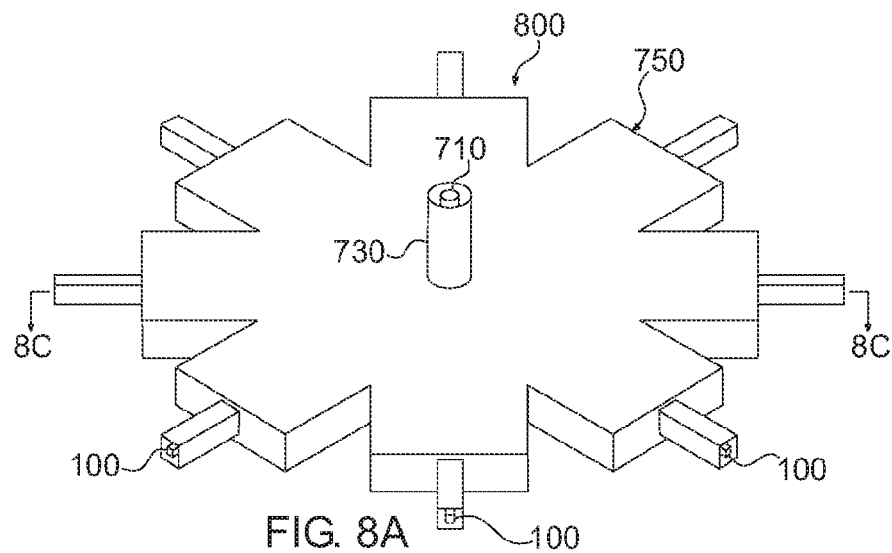
FIGS. 8A-8C schematically illustrate perspective and cross-sectional views of an exemplary 8-way waveguide power combiner/divider in accordance with the present invention which incorporates the electromagnetic end launcher of FIGS. 1A-1C into the waveguide portion of FIG. 7A.
Figure 8B:
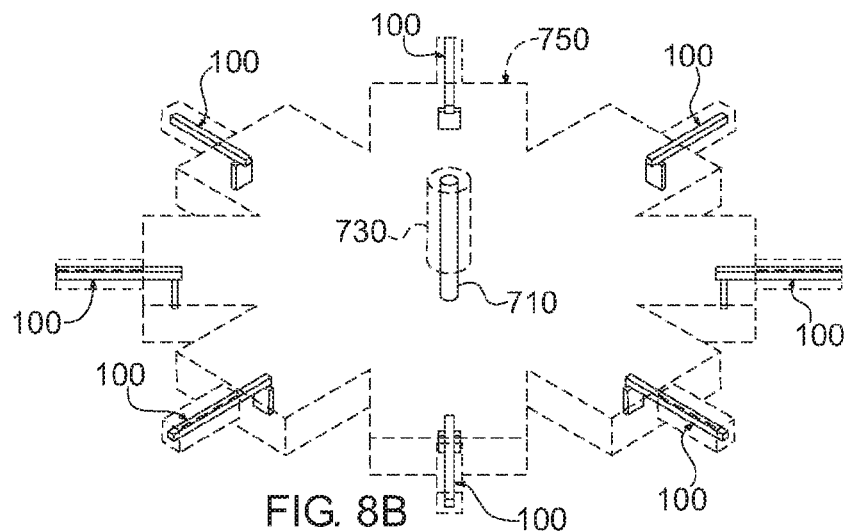
Figure 8C:
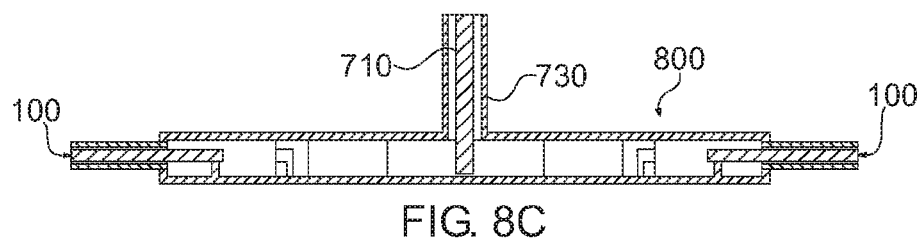
Figure 8D:
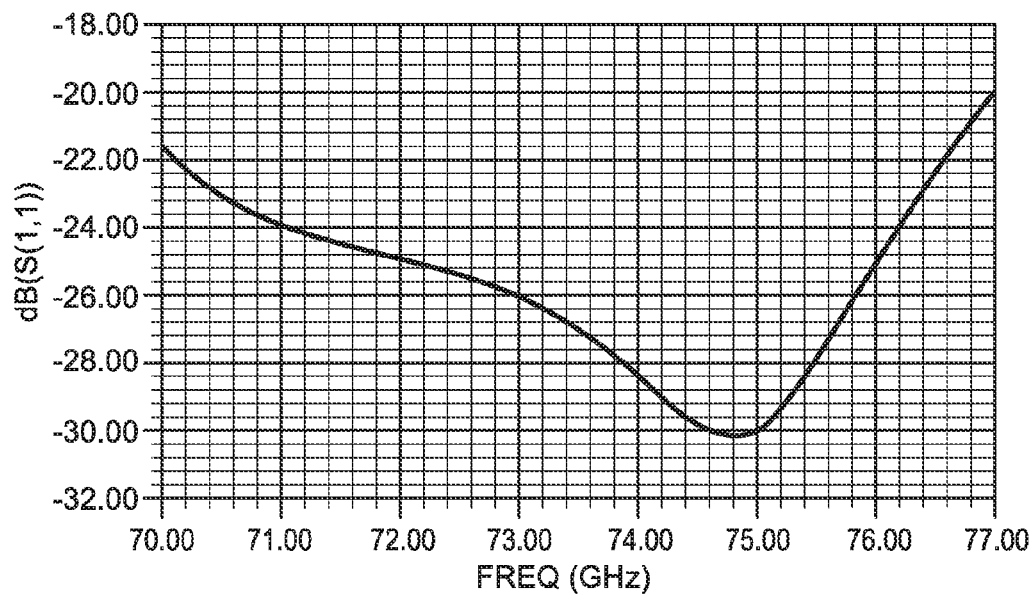
FIG. 8D illustrates the simulated performance at V-band for the waveguide power combiner/divider of FIGS. 8A-8C.
Figure 8E:
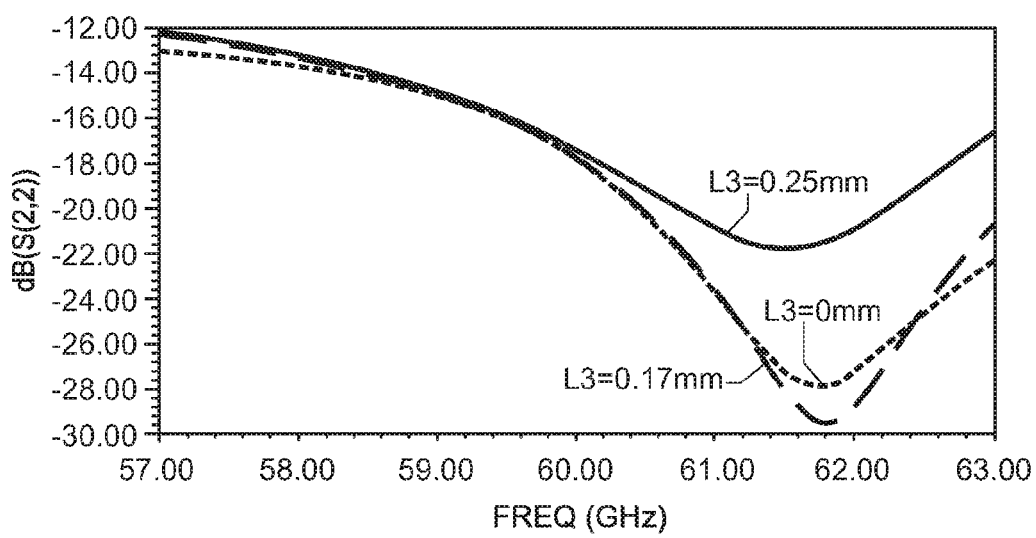
FIG. 8E illustrates the simulated effect of ground post position on impedance match S(2,2) in an 8-way waveguide power combiner/divider of the present invention.
Figure 9A:
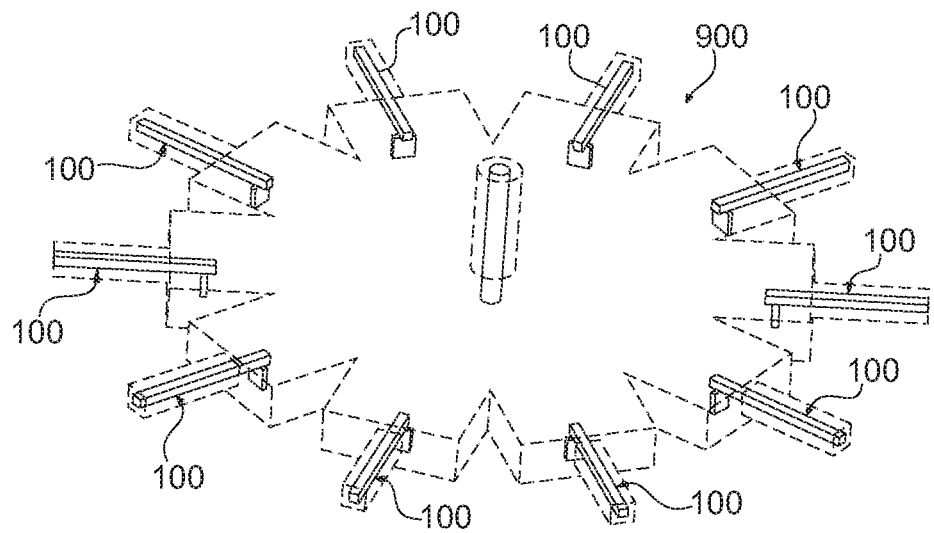
FIGS. 9A-9B schematically illustrate perspective views of exemplary 10-way and N-way waveguide power combiner/dividers in accordance with the present invention, respectively, which incorporate the electromagnetic end launcher of FIGS. 1A-1C.
Figure 9B:
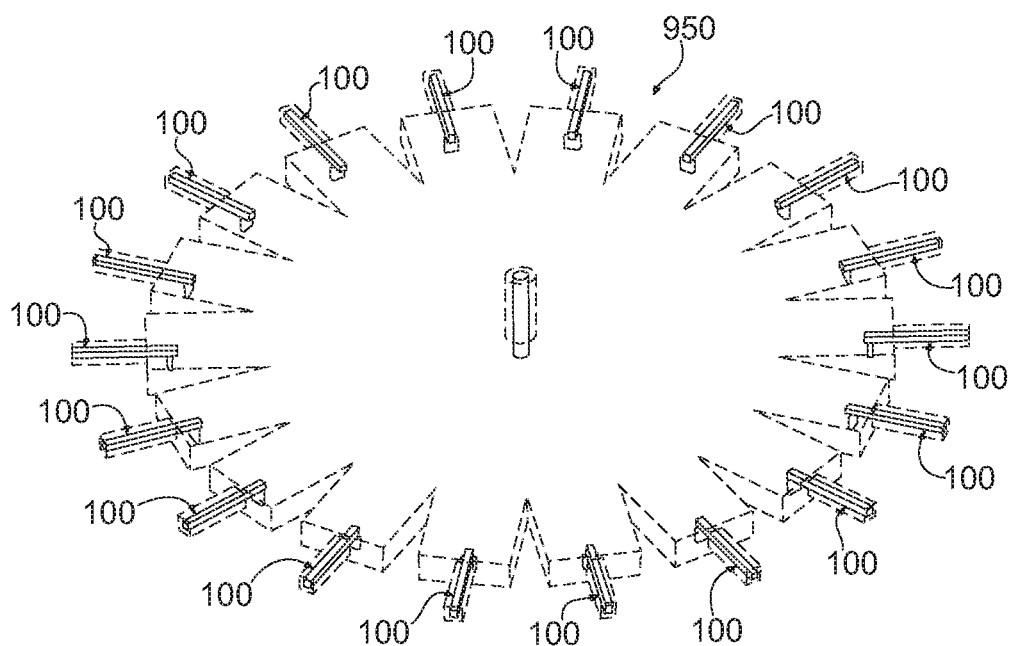

The 8-way waveguide combiner 700 may form the basis of an 8-way waveguide power combiner/divider 800, FIG. 8A-8C, in accordance with the present invention with the inclusion, for example, of the electromagnetic end launchers 100 at each waveguide portion 750 to provide eight radial feed points, in a manner similar to that illustrated in FIGS. 1A-1C, 5A. Simulated performance of the 8-way waveguide power combiner/divider 800 is illustrated in FIG. 8D, where the transmission line output port 830 is numbered as port 1 and the eight waveguide portions 750 are numbered as ports 2-9 for purposes of defining the S-parameters; the reflection loss at the transmission line output port 830 is less than 20 dB from 70 GHz to 77 GHz. The 8-way waveguide power combiner/divider 800 also provides a convenient architecture for simulating the effect of overhang length L3. For example, impedance match S(2,2) may be optimal for L3=0.17 mm from 57 GHz to 63 GHz, for L1=0.127 mm, L2=1.306, mm, W1=0.508 mm, h1=0.533 mm, and h2=1.016 mm, FIG. 8E.

Figure 10A:
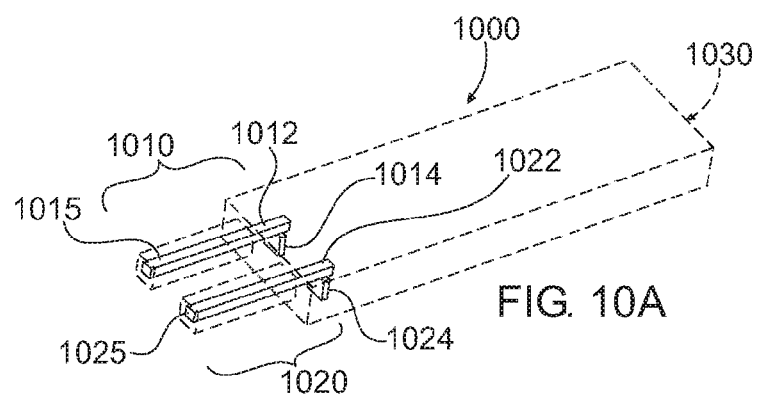
FIGS. 10A-10B schematically illustrate perspective and side elevation views, respectively, of an exemplary 2-way waveguide portion of a waveguide power combiner/divider in accordance with the present invention, which incorporates two electromagnetic end launchers of FIGS. 1A-1C.
Figure 10B:
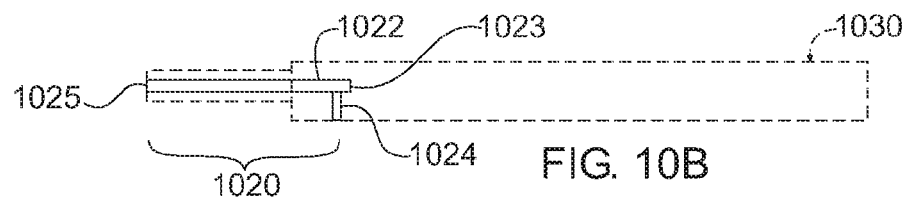
Figure 11A:
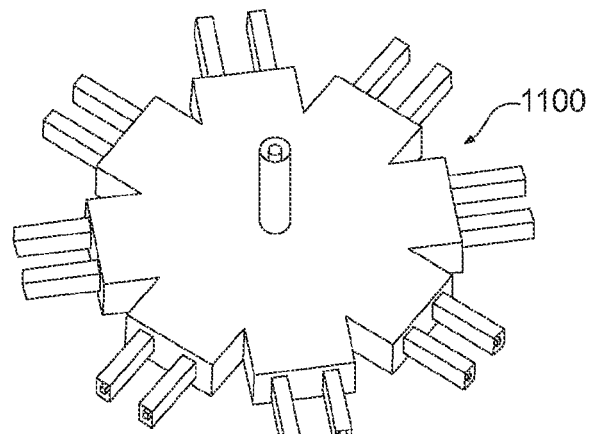
FIGS. 11A-11B schematically illustrate perspective views of an exemplary 16-way waveguide power combiner/divider in accordance with the present invention which incorporates eight 2-way waveguide portions of FIGS. 10A-10B.
Figure 11B:
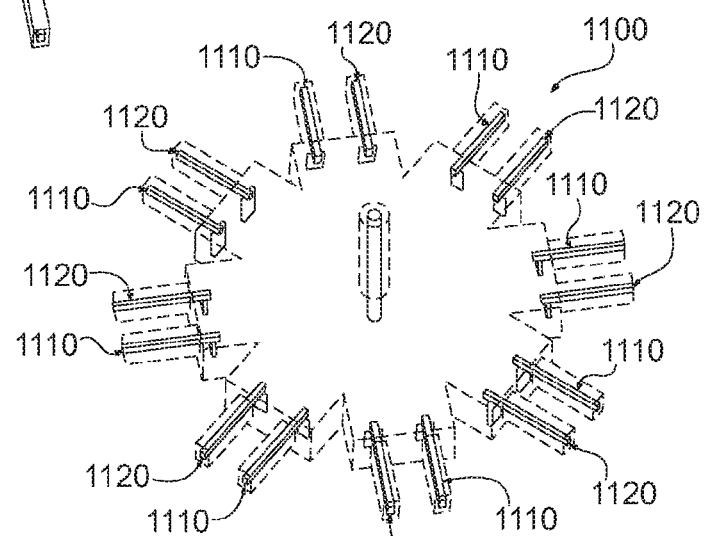

In addition to 4-way and 8-way waveguide power combiner/dividers, higher order exemplary combiner/dividers may be provided by the present invention, including a 10-way waveguide power combiner/divider 900 up to an N-way waveguide power combiner/divider 950 each of which may include the electromagnetic end launchers 100 of FIGS. 1A-1C, for example. Still higher orders of combination/division may be provided by incorporating more than one electromagnetic end launcher 100 in an associated hollow waveguide section 120. For example, two electromagnetic end launchers 1010, 1020 may be provided in a single hollow waveguide section 1030, FIGS. 10A, 10B. Similar to the electromagnetic end launcher 100 of FIGS. 1A-1C, each electromagnetic end launcher 1010, 1020 may include respective ground posts 1014, 1024, center conductor transmission lines 1015, 1025, and may also include respective longitudinally extended portions 1012, 1022 of the center conductor transmission lines which project into the hollow cavity of the hollow waveguide 1030. A 16-way waveguide power combiner/divider 1100 may then be provided using the double electromagnetic end launchers 1010, 1020 along with a 8-way waveguide combiner 700 of the type shown in FIG. 7A, for example, FIGS. 11A, 11B.

Figure 12A:
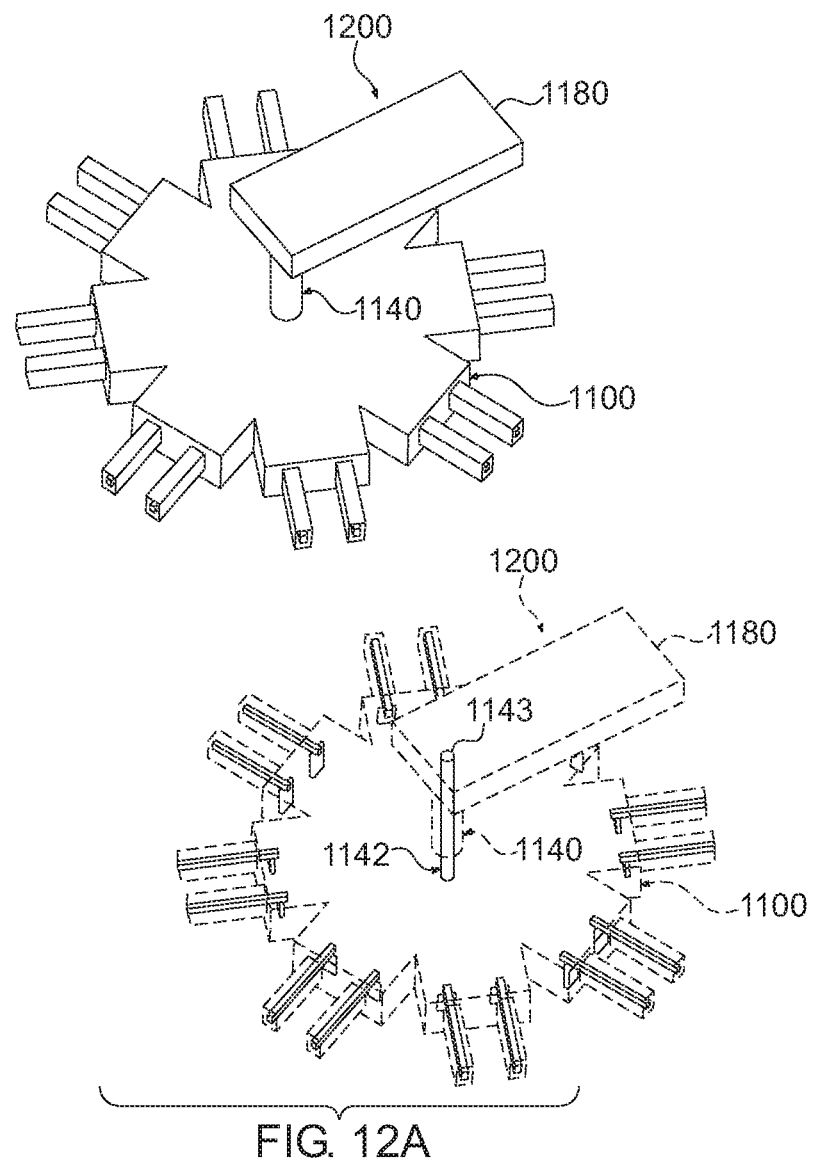
FIG. 12A schematically illustrates perspective views of the 16-way waveguide power combiner/divider of FIGS. 11A-11B with a center coax port further coupled to a hollow waveguide.
Figure 12B:
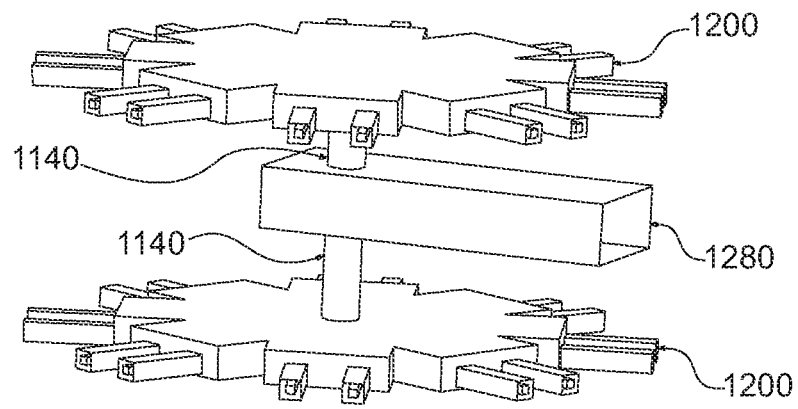
FIG. 12B schematically illustrates a perspective view of two 16-way waveguide power combiner/dividers of FIGS. 11A-11B each having a respective center coax port further coupled to a hollow waveguide.
Figure 13A:
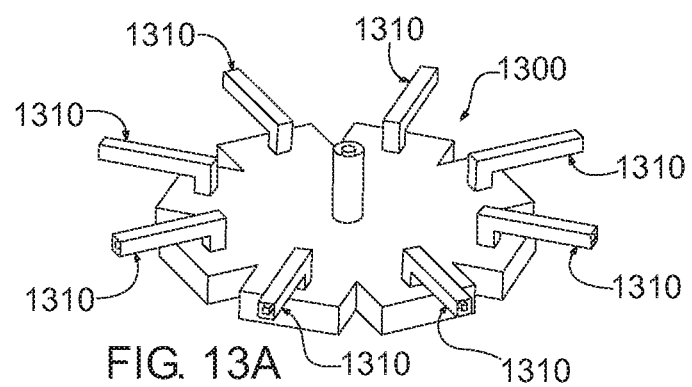
FIGS. 13A-13B schematically illustrate perspective views of an exemplary 8-way waveguide power combiner/divider having an exemplary electromagnetic end launcher in accordance with the present invention in which the transmission line includes a 90 degree turn external to the hollow waveguide.
Figure 13B:
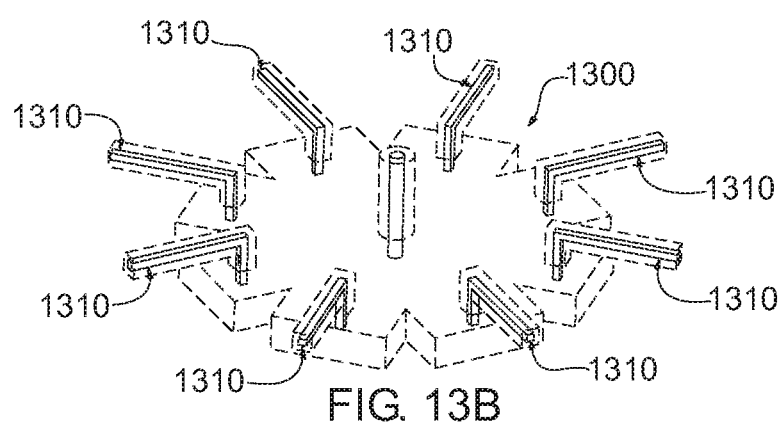
Figure 14A:
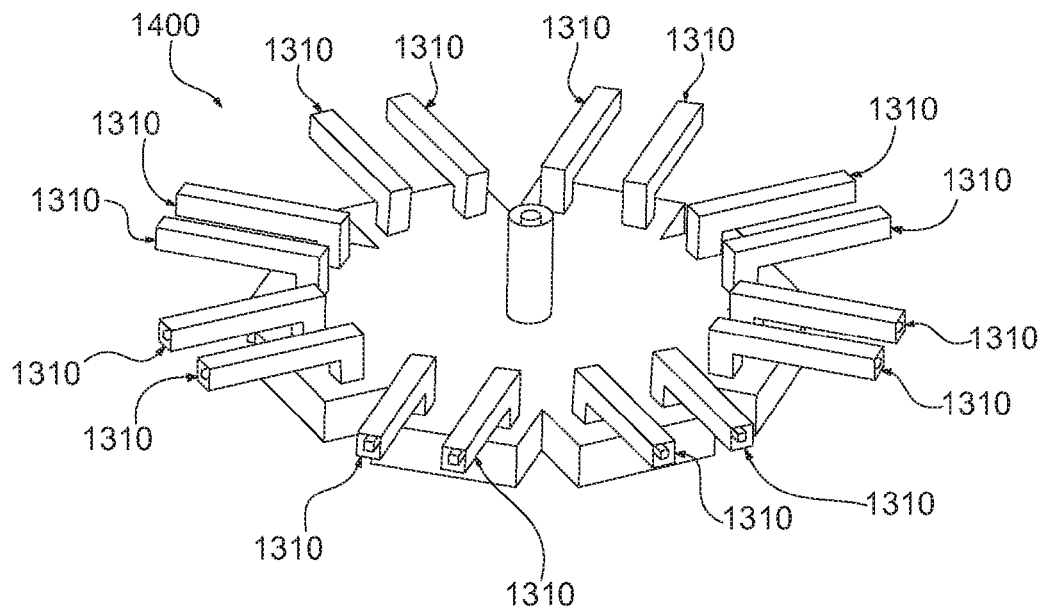
FIGS. 14A-14B schematically illustrate perspective views of an exemplary 16-way waveguide power combiner/divider having an exemplary electromagnetic end launcher similar to that of FIGS. 13A-13B.
Figure 14B:
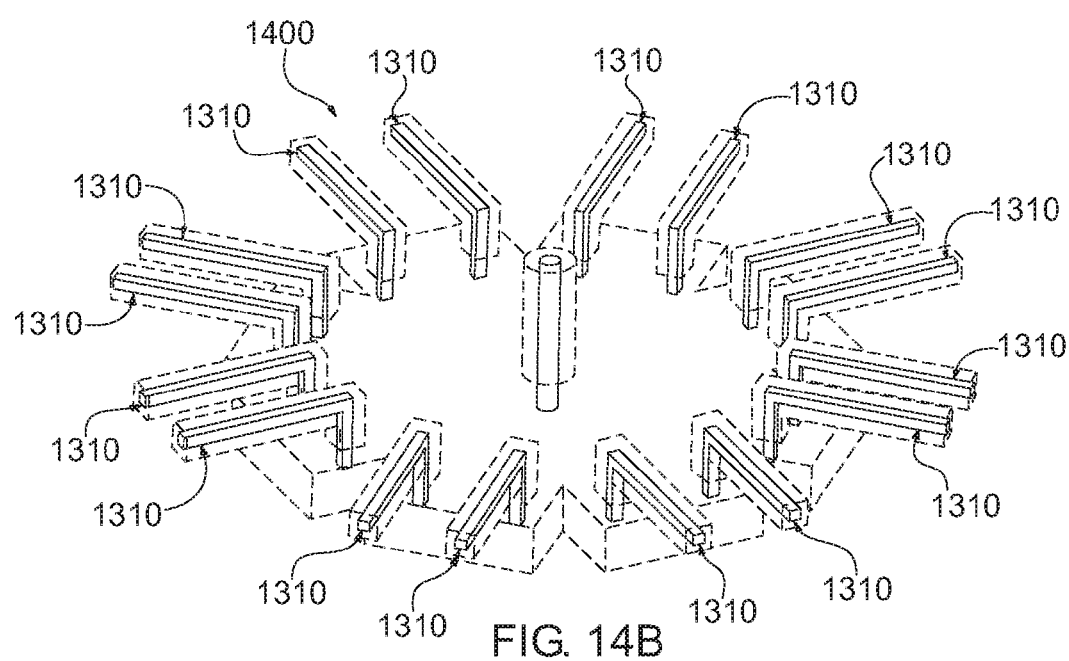

In another aspect of the present invention, any of the exemplary transmission line output ports 330, 353, 730 make be configured to further communicate with a hollow output waveguide. For example, with reference to FIG. 12A the transmission line output port 1140 of a waveguide power combiner/divider 1200 may include a center conductor transmission line 1142 that has an upwardly extending portion 1143 which may be inserted into the hollow waveguide cavity of an output waveguide 1180 to permit transmission of an RF signal present in the center conductor transmission line 1142 into a radiation mode within the cavity of the hollow output waveguide 1180. Moreover, two waveguide power combiner/dividers 1200 may communicate with a single hollow output waveguide 1280 to transmit respective output signals from a transmission line to radiation modes of the hollow output waveguide 1280, FIG. 12B. Again, as mentioned from the outset the use of the terms combiner/divider or combine/divide depend on the manner in which the associated device is used. Thus, if a radiation mode is fed as an input to the hollow output waveguide 1280, the device of FIG. 12B would function as a divider.

While the exemplary configurations of waveguide power combiner/dividers 500, 800, 900, 950, 1100, 1200 have been illustrated with feed through electromagnetic end launchers 100 in-plane and the transmission line output ports 230, 730, 1140 perpendicular, other construction axes are possible. For instance, similar performance may be possible when including all inputs and outputs in one plane, all inputs and outputs orthogonal in at least one axis, and other various combinations and variations. For example, electromagnetic end launchers 1310 of the present invention may enter a waveguide power combiner/divider 1300, 1400 through an upper wall of the waveguide power combiner/divider 1300, 1400, FIGS. 13A-14B.

In another of its aspects the present invention provides waveguide power combiner/divider structures, such as those shown and described in connection with FIGS. 1A-14B, implemented on a substrate including a wafer containing active devices. A power combiner/divider SSPA 1500, 1550 may include one or more drivers 1512, pre-drivers 1510, an N-way input power divider, such as a 4-way divider 1516 or cascading 2-way dividers 1518-1520, amplifier modules 1514, a microfabricated waveguide power combiner/divider 800, and/or an air-coax or waveguide output 730. The length of a divider network, for example, an air coax divider feeding each amplifier module 1514, i.e., the dividers 1518-1520, may be the same length in order to keep the same phase. N-way combiner/dividers may be implemented using cascading 2-way splits, which can be done in both waveguides with conducting transmission lines, such as coaxial or hollow core propagating mode waveguide structures, e.g., rectangular and/or folded hollow core waveguides, FIG. 17. The input power dividers 1518-1520 may use an air-coax line or, a traditional transmission line (e.g. such as a microstrip or stripline), since the input network may not be critical for power combining efficiency.

The power combiner/divider SSPA 1500, 1550 may include an air-coax combiner, phase shifters, filters and/or linearizers. Signals to be amplified may be fed from an input port 1501 through the circuit into an input divider, for example a Gysel or Wilkinson 2-, 4-, or N-way divider which may be based on waveguides such as micro-coaxial dividers. The divided signal may then be amplified using amplifier modules 1514 with the output power from the amplifier modules 1514 transferred into a microfabricated waveguide power combiner/divider 800 which may incorporate an integrated means of producing a controlled alignment of radiation modes in the waveguide combiner 800.

Because most of all power amplifier MMIC chips in SSPA 1500, 1550 may be mounted on the same base plate or by joining two assemblies, the heat generated by the MMICs can be dissipated through a heat sink with a low thermal resistance to the chips, which can be mounted on the packaging of the system, which may achieve optimal thermal dissipation. A cooling system (e.g., such as cooling pipes or fins) may be integrated into the base plate. Alternatively or additionally, a cooling gas or an inert cooling fluid may be applied within the module, the thermal base plate, or the heat sink. A sub-module may also be provided which may include multiple MMIC chips that are combined with a low loss air-coax combiner and divider. The sub-module may be tested separately before the final assembly and/or may be replaced for repairing. In addition, exemplary MMIC chips may include a linearization circuit using pre-distortion or feed-forward techniques and/or may use high isolation and low insertion loss switches in sections of the combiner or between stages of the combiner circuit to allow regions to operate relatively independently of other regions without suffering excess inefficiency in the amplifier operating at different power levels. Signals from each channel may then be further combined to higher power levels in a reduced height waveguide combiner and delivered to an air-coax or waveguide output. From a coax output for example, the amplified signal can be transferred to a standard waveguide if a waveguide interface is desired.

Figure 15A:
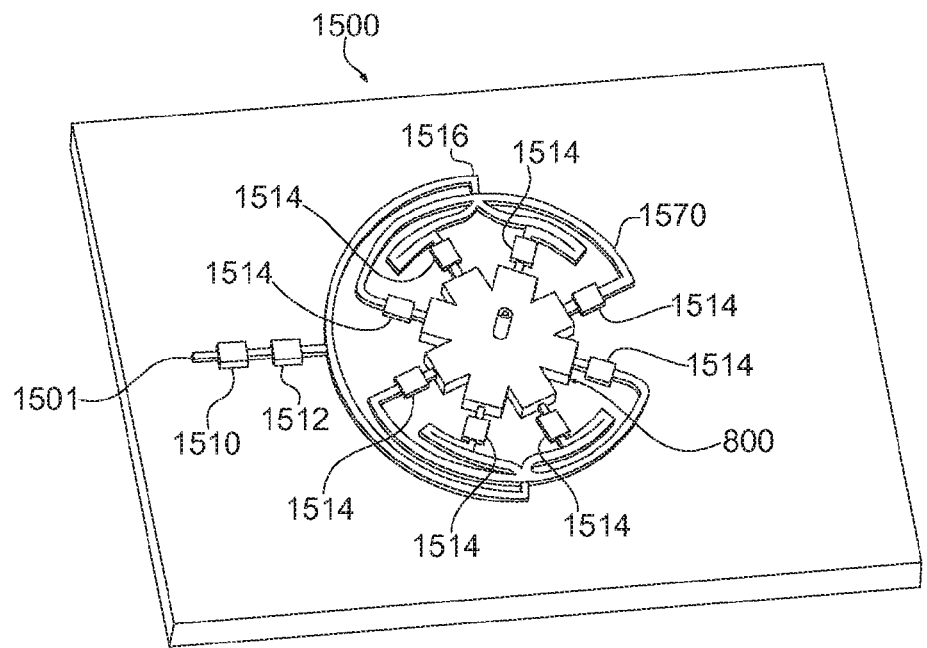
FIGS. 15A-15B schematically illustrate perspective views of exemplary solid state power amplifier (SSPA) implementations of waveguide power combiner/dividers in accordance with the present invention.
Figure 15B:
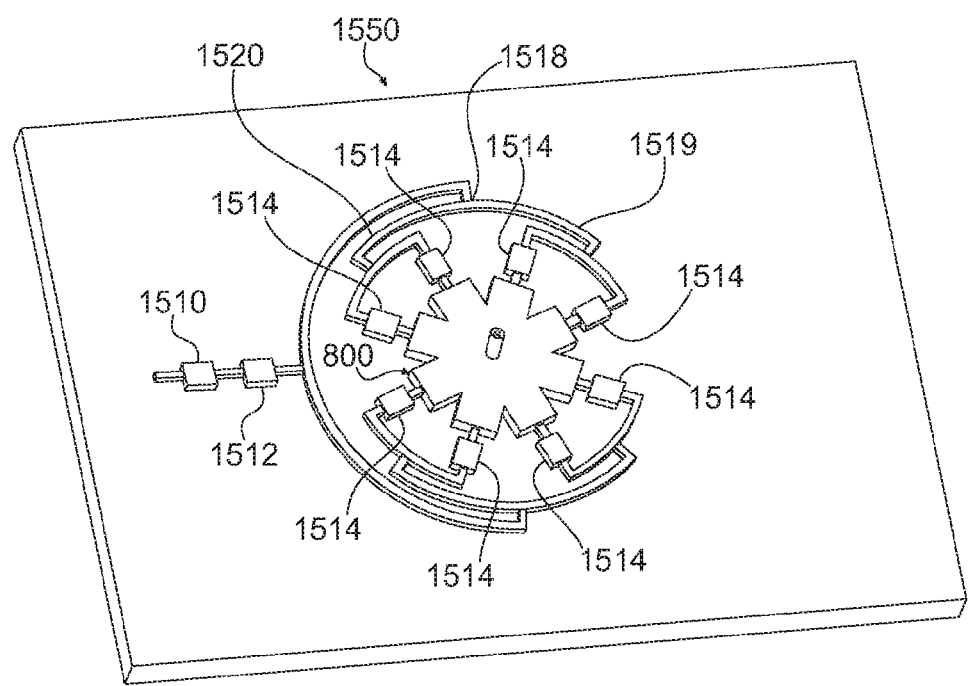
Figure 16:
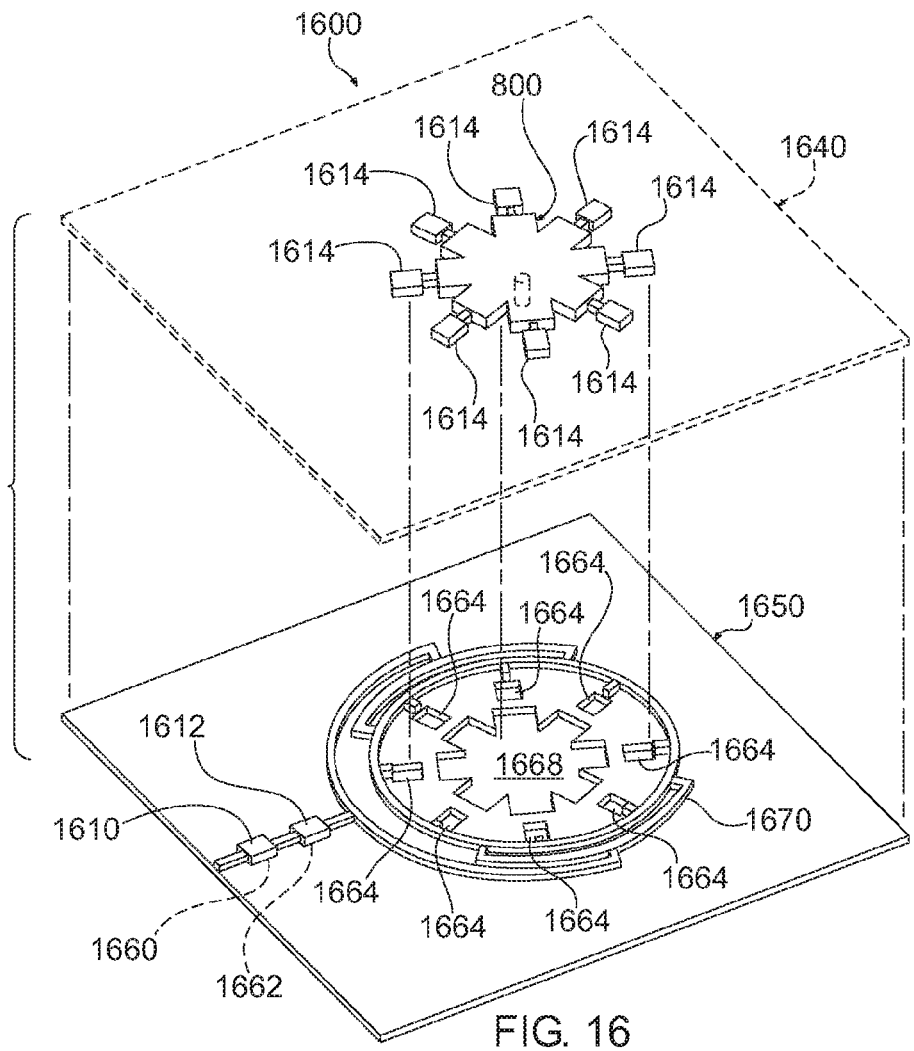
FIG. 16 schematically illustrates a SSPA constructed from a substrate with preamplifiers and a divider network, a waveguide combiner, and MMIC power amplifiers or MMIC power combiner module sub-assemblies, in accordance with the present invention.
Figure 17:
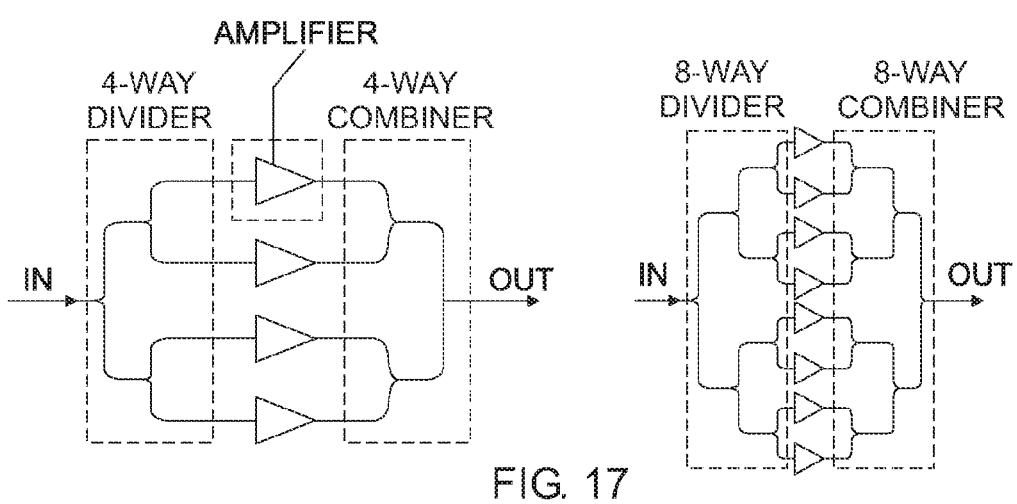
FIG. 17 schematically illustrates amplifier circuit block diagrams herein used as amplifier module subassemblies or sub-modules showing that a combiner/divider structure may use cascading 2-way splits to combine/divide 2 or more, e.g., 4 or 8, channels.

In one exemplary configuration, the SSPA 1500, 1550 may be constructed from an upper assembly 1640 and a lower assembly 1650, SSPA 1600 FIG. 16. The upper assembly 1640 may include amplifier modules 1614, and a microfabricated waveguide power combiner 800. Amplifier modules 1614 may be a MMIC such as a power amplifier MMIC, or may be themselves a sub-module or assembly of chips, such as several amplifier MMICs. More than one type of MMIC or chip may be part of the modules 1614, for example, a phase shifter and/or attenuator may be included before the MMIC power amplifier to adjust phase or power of the power amplifier MMIC or power amplifier transistors. The modules or subassemblies 1614 may include a divider and combiner network as shown in FIG. 17, which shows a 4-way and also an 8-way divider and combiner on the input and output ports of the amplifier chips shown in the middle. Such an output combiner network for the module 1614 may be made, for example, using a micro-coaxial combiner having the advantage of providing port to port isolation. The isolation may be achieved using a combiner structure such as a Wilkinson or Gysel or other suitable transmission line power combiner. Advantages of incorporating a combiner structure such as a Wilkinson or Gysel in advance of the hollow waveguide combiner is that that in the event of single or multiple power amplifier MMIC failure or failures, the increased isolation provided for each chip will prevent reflected power from interfering with the other MMIC amplifier chips. This is because the reflected power can be absorbed by one or more isolation resistors. Adding quadrature combining to these transmission line combiner modules may further improve the match of MMIC power amplifiers and can be incorporated. The lower assembly 1650 may include an input power divider network 1670 fabricated using traditional stripline, microstrip, or micro-coax, or a waveguide divider, for example. While loss is a primary consideration for the output power combiner after the amplifier chips or chip modules 1614, the input divider may have higher insertion loss. The lower assembly 1650 may also include all the direct current (DC) routing (not shown), and the DC lines may be shielded, for example by being separated by ground planes. A preamplifier may be made of one or two stages of amplifier chips or MMICs shown as 1610 and 1612. They may be integrated into lower assembly 1650 and used to feed or drive the combiner upper assembly 1640. The upper and lower assemblies 1640, 1650 may be configured to be joined to operably interconnect the various components disposed thereon. For example, the lower substrate 1650 may include recessed areas or openings 1660, 1662, 1664, 1668 to receive the pre-driver 1610, 1612, amplifier modules 1614, and waveguide power combiner/divider 800, respectively. RF signals running through the power divider network 1670 may be coupled into the amplifier modules 1614 through respective input ports, as best seen in the assembled SSPAs 1500, 1550 of FIGS. 15A, 15B.

One or more waveguide combiners may feed one or more waveguide combiners in series and/or parallel. They may combine one or more connector structures to interface to one or more input or output ports. They may be made in a modular format to allow a product that can be scaled upward or downward in power while still using similar components.

Another point to be appreciated from the dimensional simulations of FIGS. 3A-3C, 8E is the importance of submicron dimensional and placement control of the electromagnetic end launcher component structures (e.g., structures 102-106, 120, 122) in the overall waveguide power combiner/dividers of the present invention. Optimal launch performance might only be achieved by a very tight control of the dimensions of the launch. This becomes even more critical as the frequency increases and the size of the electromagnetic end launcher decreases. Thus, in another of its aspects the present invention relates to suitable microfabrication processes which permit the precision manufacturing of small parts, typically on a wafer or grid-level or in a batch. For example, processes such as PolyStrata® processing, stereolithography, or solid printing are suitable batch processes where the forming steps act in parallel on a number of parts to provide a sequential build manufacturing process.

Microfabrication is a manufacturing technology typically whereby the combination of lithographic patterning combined with material additive and/or material removal processes create 3D structures with precision typically in the microns to submicron scale. Often these additive or removal processes are iterative and use one or more of vacuum processing, spin-coating, chemical, plasma, or mechanical processes and are applied across a mostly planar substrate surface in, or on, which the devices will be formed. Step-by-step the iterations typically create the devices on a grid of regions on a surface. The devices are typically formed within, or on top of, substrates including but not limited to silicon, glass, ceramic, and/or metal. For example, an 8" diameter silicon wafer, similar to those used for making integrated circuits, is often chosen for the wafer's flat surface and the ability for the wafer to survive many additive and/or subtractive material processes with patterning optionally at every layer. Typically, micro-fabricated structures are in the square mm size regime.

The waveguiding components of the waveguide power combiner/dividers and associated componentry illustrated and discussed in connection with FIGS. 1A-17 may be monolithically formed together or may be separately formed in one or more parts and then may be integrated using alignment structures formed by the microfabrication process. Since the electromagnetic end launchers together with waveguide power combiner/dividers may be built by a consistent microfabrication process, optimized manufacturing repeatability and/or optimized performance may be achieved at even higher frequencies. The PolyStrata® process enables such precision and therefore high quality performance. (The PolyStrata® process is disclosed in U.S. Pat. Nos. 7,012,489, 7,148,772, 7,405,638, 7,948,335, 7,649,432, 7,656,256, 8,031,037, 7,755,174, and 7,898,356, the contents of which patents are incorporated herein by reference.)

A key difference between microfabrication methodologies and other related precision machining techniques (laser drilling, precision CNC, electro-discharge machining (EDM)) is the parallel processing of many devices at a time on at least one substrate (and usually more than one substrate) combined as well as the material complexity and diversity that can be involved. For example, a device made of conductors, non-conductors, and containing multiple layers and enclosed regions cannot typically be formed with the precision or complexity using the aforementioned methods without some form of integration, alignment, and bonding. Compared to microfabrication, most types of precision machining typically process only one device at a time as opposed to many devices produced typically in layers in a batch. With microfabrication, the additive or subtractive processes are applied across a whole substrate (with sometimes thousands of devices per substrate) at once. Thus, manufacturing of many devices with micron precision can be achieved rapidly with low labor content. Microfabrication has continued to emerge as a leading fabrication approach for future micro-mechanical and micro-electro-mechanical devices.

In particular, the PolyStrata® process combines the option for processing of both metals and dielectrics in a micromachining technology specifically suited to the manufacture of devices of the present invention. The PolyStrata® process may be used to create air-dielectric microwave transmission components. The features of each stratum across a wafer may be defined using photolithography. The x-y alignment from layer to layer may be done typically with ±2 µm in-plane accuracy, for example, across a 50 mm, 100 mm, 150 mm, 800 mm, or 1200 mm substrate such as a ceramic, SiC, silicon, copper, or stainless steel wafer. (While some materials have been named, alternative materials may be substituted to produce structures with similar functions.) The wafer may, or may not, contain active devices in or on its surface some of which may be designated to be in communication with the microstructures to be built by the micromachining process. In the PolyStrata® process, once a pattern has been defined and developed over a region that is conductive, a photoresist, or molding material which may define the pattern, may be used as a mold for plating conductive features, e.g., a metal, such as copper. The copper may be planarized, for example, using a chemical-mechanical polishing (CMP), lapping, turning, or a combination of these and/or similar methods. The mold material and the fill material such as copper may or may not be planarized simultaneously in one or more of these steps. At this juncture, photo-patternable permanent dielectric supports, features, or sheets may be embedded in the device or formed over or in the layer, or the photolithography process begun anew, and the steps repeated. This process may continue until the entire height of the structure or structures being formed has been achieved. The photoresist or mold material may then be dissolved to leave air-filled copper structures with dielectric supports for the center conductor. The resulting structures may have strata, or layers, of thicknesses from 5-100 µm. As such, exemplary structures disclosed herein having sufficient height requirements, such as for example ground posts 104, sidewalls of hollow waveguides 120, 250, transmission line output ports 330, 350, and so forth, may be built layer-by-layer and comprise a plurality of layers or strata.

In view of the foregoing, devices and methods of the present invention can be expected to provide advances in the art, such as: increased fabrication speed, decreased cost, and increased ease to produce parts in large quantities over traditional machining of parts which require techniques such as EDM or laser processes; increased versatility in producing complex geometries, especially 3D and enclosed geometries; lower loss at high frequencies due to improvements in parasitic effects and substrate tangent loss; increased tolerance control based on monolithic fabrication of electromagnetic end launchers with waveguide power combiner/dividers, affording lower losses at high frequencies such as at Ka-, V-, and W-band, with no need for adjustment or tuning of the positions; increased room for a heat sink, which may improve thermal dissipation; and, reduction of phase and amplitude errors that reduce the combining efficiency.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A waveguide power combiner/divider for operation at a selected wavelength, comprising:
   a plurality of hollow waveguides each having a hollow core surrounded by a waveguide wall configured to support at least one radiation mode therein;
   an output port in communication the plurality of hollow waveguides to permit communication of radiation modes between the port and the hollow waveguides; and
   a plurality of transmission line waveguides having a center conductor transmission line disposed therein, each of the transmission line waveguides having an electromagnetic end launcher operably extending into respective first ends of the plurality of hollow waveguides, each launcher having a terminus suspended within the hollow core out of contact with the waveguide wall.

2. The waveguide power combiner/divider of claim 1, comprising a plurality of ground posts each disposed at a respective end launcher in electrical communication with the center conductor and a wall of the hollow waveguide, respectively, to ground the end launcher to the hollow waveguide wall.

3. The waveguide combiner/divider according to claim 2, wherein the end launcher has a distal end and wherein the ground post is disposed inward from the distal end to provide an overhang portion of the distal end.

4. The waveguide combiner/divider according to claim 2, wherein the sum of the length of the end launcher and the height of the respective ground post is about ¼ of the selected wavelength.

5. The waveguide combiner/divider according to claim 1, wherein the transmission line waveguides comprise a coax structure.

6. The waveguide combiner/divider according to claim 1, wherein one or more of the hollow waveguides and transmission line waveguides comprises a layered structure comprising a plurality of layers.

7. The waveguide combiner/divider according to claim 6, wherein the plurality of layers of at least one of the hollow waveguides and transmission line waveguides comprise the same material.

8. The waveguide combiner/divider according to claim 1, wherein the plurality of transmission line waveguides comprises two transmission line waveguides operably connected to a respective first end of one of the hollow waveguides.

9. The waveguide combiner/divider according to claim 1, wherein the hollow waveguides are coplanar to one another and wherein a longitudinal axis of the center conductor transmission line is parallel to the coplanar plane of the hollow waveguides.

10. A waveguide power combiner/divider for operation at a selected wavelength, comprising:
    a plurality of hollow waveguides each having a hollow core configured to support at least one radiation mode therein;
    an output port in communication the plurality of hollow waveguides to permit communication of radiation modes between the port and the hollow waveguides;
    a plurality of transmission line waveguides having a center conductor transmission line disposed therein, each of the transmission line waveguides having an electromagnetic end launcher operably extending into respective first ends of the plurality of hollow waveguides; and
    a plurality of ground posts each disposed at a respective end launcher in electrical communication with the center conductor and a wall of the hollow waveguide, respectively, to ground the end launcher to the hollow waveguide wall.

11. The waveguide combiner/divider according to claim 10, wherein the end launcher has a distal end and wherein the ground post is disposed inward from the distal end to provide an overhang portion of the distal end.

12. The waveguide combiner/divider according to claim 10, wherein the sum of the length of the end launcher and the height of the respective ground post is about ¼ of the selected wavelength.

13. A waveguide power combiner/divider for operation at a selected wavelength, comprising:
- a plurality of hollow waveguides each having a hollow core configured to support at least one radiation mode therein;
- an output port in communication the plurality of hollow waveguides to permit communication of radiation modes between the port and the hollow waveguides; and
- a plurality of transmission line waveguides having a center conductor transmission line disposed therein, each of the transmission line waveguides having an electromagnetic end launcher operably extending into respective first ends of the plurality of hollow waveguides,
- wherein one or more of the hollow waveguides and transmission line waveguides comprises a layered structure comprising a plurality of layers.

14. The waveguide combiner/divider according to claim 13, wherein the plurality of layers of at least one of the hollow waveguides and transmission line waveguides comprise the same material.

15. A waveguide power combiner/divider for operation at a selected wavelength, comprising:
- a plurality of hollow waveguides each having a hollow core configured to support at least one radiation mode therein;
- an output port in communication the plurality of hollow waveguides to permit communication of radiation modes between the port and the hollow waveguides; and
- a plurality of transmission line waveguides having a center conductor transmission line disposed therein, each of the transmission line waveguides having an electromagnetic end launcher operably extending into respective first ends of the plurality of hollow waveguides,
- wherein the plurality of transmission line waveguides comprises two transmission line waveguides operably connected to a respective first end of one of the hollow waveguides.

* * * * *